United States Patent
Watarai

(10) Patent No.: US 8,188,779 B2
(45) Date of Patent: May 29, 2012

(54) DUTY CONTROL BUFFER CIRCUIT AND DUTY CORRECTION CIRCUIT

(75) Inventor: Seiichi Watarai, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 25 days.

(21) Appl. No.: 12/654,107

(22) Filed: Dec. 10, 2009

(65) Prior Publication Data
US 2010/0148835 A1 Jun. 17, 2010

(30) Foreign Application Priority Data
Dec. 12, 2008 (JP) ................. 2008-316955

(51) Int. Cl.
*H03K 3/017* (2006.01)
*H03K 5/04* (2006.01)
*H03K 7/08* (2006.01)
(52) U.S. Cl. ...................................... 327/175
(58) Field of Classification Search ............ 327/175
See application file for complete search history.

(56) References Cited

U.S. PATENT DOCUMENTS

| 7,282,976 | B2 | 10/2007 | Park | |
|---|---|---|---|---|
| 7,336,114 | B2 * | 2/2008 | Razavi et al. | 327/199 |
| 7,750,703 | B2 * | 7/2010 | Yun et al. | 327/175 |
| 2003/0200494 | A1 * | 10/2003 | Campbell | 714/726 |

FOREIGN PATENT DOCUMENTS

JP  2005-136949  5/2005

* cited by examiner

*Primary Examiner* — Lincoln Donovan
*Assistant Examiner* — Daniel Rojas
(74) *Attorney, Agent, or Firm* — McGinn IP Law Group, PLLC

(57) ABSTRACT

The circuit includes a duty control buffer and a duty control voltage generator that receives outputs of the duty control buffer, detects a duty error, and generates control signals. The duty control buffer includes a differential stage including unbalanced first and second differential pairs each differentially receiving input signals, a load element pair connected between output pairs of the first and second differential pairs and a power supply, and a current source stage that supplies respective driving currents to the first and second differential pairs.

6 Claims, 21 Drawing Sheets

FIG.3 RELATED ART (COMPARATIVE EXAMPLE)

COMPARATIVE EXAMPLE

INPUT
WAVEFORMS

WAVEFORMS
AFTER DUTY
CORRECTION

WAVEFORMS OF
BUFFER IN STAGE
SUBSEQUENT TO
DUTY CORRECTION
CIRCUIT

CONTROL VOLTAGES
GENERATED FOR
DUTY CORRECTION

COMPARATIVE EXAMPLE

INPUT
WAVEFORMS

WAVEFORMS
AFTER DUTY
CORRECTION

WAVEFORMS OF
BUFFER IN STAGE
SUBSEQUENT TO
DUTY CORRECTION
CIRCUIT

CONTROL VOLTAGES
GENERATED FOR
DUTY CORRECTION

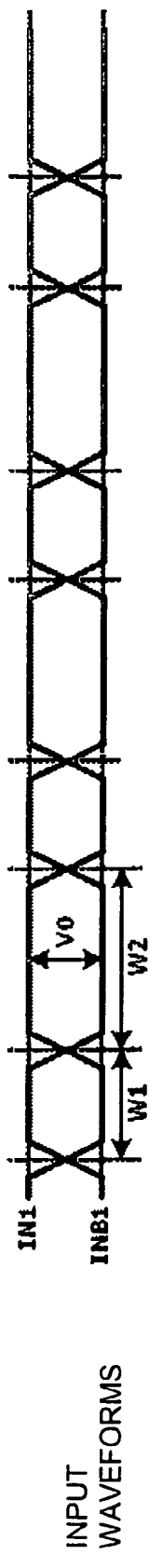
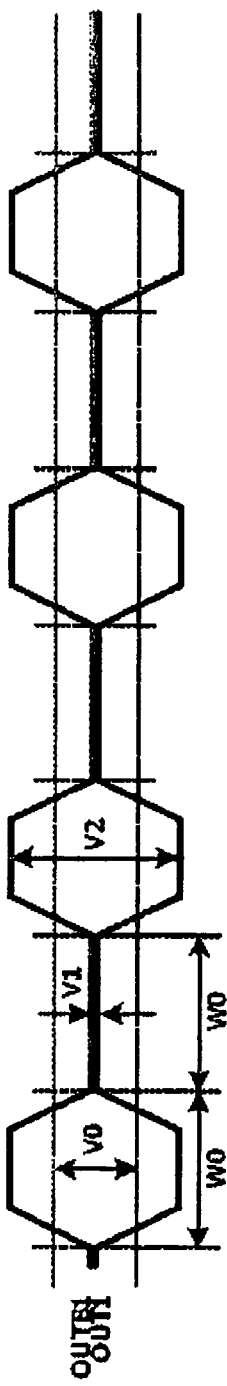
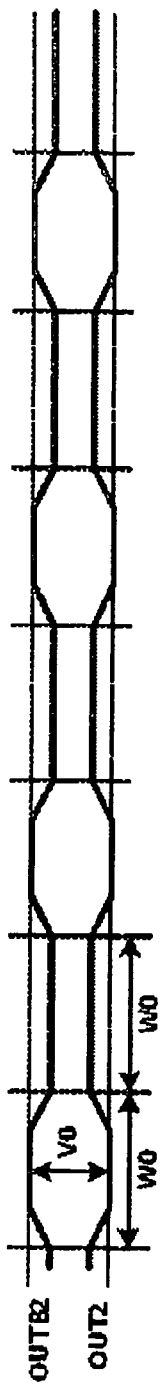
FIG.8A INPUT WAVEFORMS
FIG.8B WAVEFORMS AFTER DUTY CORRECTION
FIG.8C WAVEFORMS OF BUFFER IN STAGE SUBSEQUENT TO DUTY CORRECTION CIRCUIT

COMPARATIVE EXAMPLE

INPUT
WAVEFORMS

WAVEFORMS
AFTER DUTY
CORRECTION

WAVEFORMS OF
BUFFER IN STAGE
SUBSEQUENT TO
DUTY CORRECTION
CIRCUIT

INPUT WAVEFORMS

WAVEFORMS GENERATED BY CIRCUIT FORMED OF TRANSISTORS NA1 TO NA4

INPUT WAVEFORMS

WAVEFORMS GENERATED BY CIRCUIT FORMED OF TRANSISTORS NB1 TO NB4

WAVEFORMS
GENERATED BY
CIRCUIT FORMED
OF TRANSISTORS
NA1 TO NA4

WAVEFORMS
GENERATED BY
CIRCUIT FORMED
OF TRANSISTORS
NB1 TO NB4

WAVEFORMS OF
OUTPUTS OUT1/OUTB1
SYNTHEZED BY
FEEDBACK

CONTROL VOLTAGES
GENERATED FOR DUTY
CORRECTION

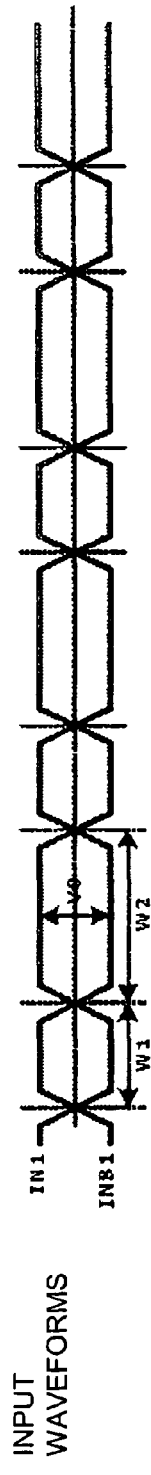
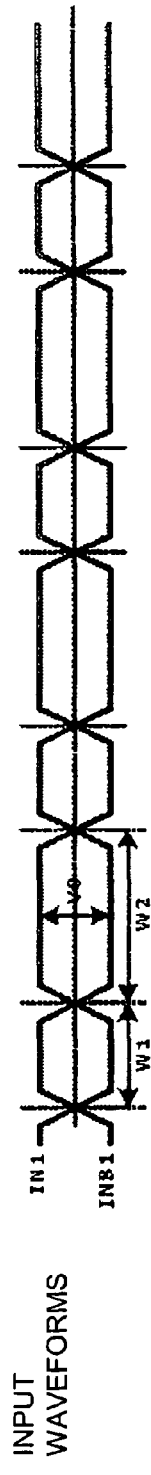
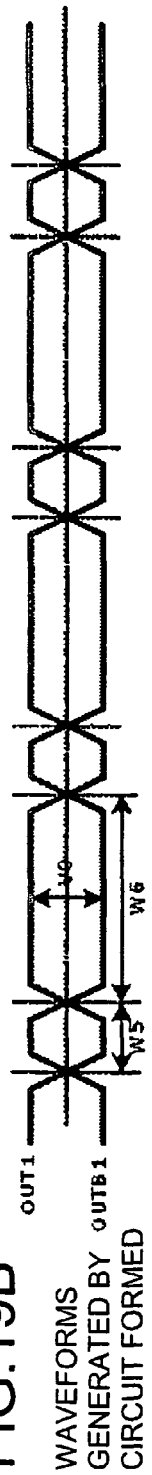
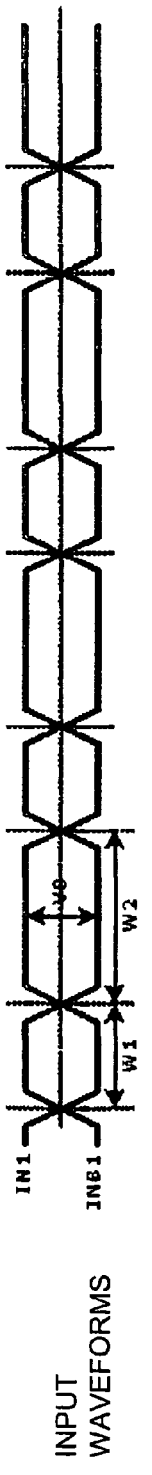
FIG. 19A INPUT WAVEFORMS
FIG. 19B WAVEFORMS GENERATED BY CIRCUIT FORMED OF TRANSISTORS NA1 TO NA4
FIG. 19C INPUT WAVEFORMS
FIG. 19D WAVEFORMS GENERATED BY CIRCUIT FORMED OF TRANSISTORS NB1 TO NB4

WAVEFORMS
GENERATED BY
CIRCUIT FORMED
OF TRANSISTORS
NA1 TO NA4

WAVEFORMS
GENERATED BY
CIRCUIT FORMED
OF TRANSISTORS
NB1 TO NB4

WAVEFORMS OF
OUTPUTS OUT1/OUTB1
SYNTHEZED BY
FEEDBACK

CONTROL VOLTAGES
GENERATED FOR DUTY
CORRECTION

DUTY CONTROL BUFFER CIRCUIT AND DUTY CORRECTION CIRCUIT

REFERENCE TO RELATED APPLICATION

This application claims the benefit of previous Japanese Patent Application No. 2008-316955, filed on Dec. 12, 2008, which is hereby incorporated by reference herein in its entirety.

FIELD OF THE INVENTION

The present invention relates to a duty correction circuit including.

BACKGROUND OF THE INVENTION

A configuration as shown in FIG. 1, for example, is known as a duty correction circuit used in a delay lock loop (Delay Lock Loop) or the like. FIG. 1 is based on FIG. 2 in Patent Document 1. In FIG. 1, circuit blocks, names of signals, reference numerals are different from those in FIG. 2 in Patent Document 1 (In FIG. 1, an rst signal and a reset terminal of FIG. 2 in Patent Document 1 are omitted).

Referring to FIG. 1, the duty correction circuit includes a duty control buffer 10 that differentially receives complementary input signals IN1 and INB1 and a duty control voltage generator 20 that receives signals OUT1 and OUTB1 output differentially from the duty control buffer 10, detects a duty error between the signals OUT1 and OUTB1, and differentially outputs a first duty control voltage signal VCNT1 and a second duty control voltage signal VCNTB1 corresponding to the duty error. In the duty control voltage generator 20, respective potentials of the signals OUT1 and OUTB1 are integrated. Then, an amount of duty deterioration (time difference between a High level period and a Low level period) is converted to a potential difference between the first duty control voltage signal VCNT1 and the second duty control voltage signal VCNTB. In the duty control buffer 10, the potential difference between the first duty control voltage signal VCNT1 and the second duty control voltage signal VCNTB1 is converted to a difference voltage between respective center voltages (offsets) of the signals OUT1 and OUTB to perform duty correction.

[Patent Document 1] JP Patent Kokai Publication No. JP-P-2005-136949A

SUMMARY

An analysis by the present invention will be given below. The following problems will be described in detail as the problems of a comparative example.

In case it is assumed that waveform blunting (during a rising or falling transition time) of the output signals OUT1 and OUTB1 of the duty control buffer is small in the configuration shown in FIG. 1, even if the potential difference between the center voltages of the output signals OUT1 and OUTB1 is increased to correct a duty error, duty correction may not be able to be sufficiently performed and pulse of the output signals OUT1 and OUTB1 may then vanish.

Further, in a differential circuit (not shown in FIG. 1) that differentially receives the output signals OUT1 and OUTB1, duty deterioration occurs due to an offset in a differential pair which is generated due to fabrication variation or the like.

The present invention solves one or more of the problems described above.

The invention disclosed in this application is summarized as follows.

According to the present invention, there is provided a duty correction circuit which includes:

a first circuit that receives an input signal and generates a first signal of which a rising transition responsive to a transition of the input signal is delayed or quickened; and a second circuit that receives the input signal and generates a second signal of which a falling transition responsive to the transition of the input signal is delayed or quickened. A signal waveform obtained by combining the first signal and the second signal is output.

According to the present invention, there is provided a circuit including:

a first differential circuit that differentially receives input signals and generates first differential output signals comprising a non-inverting output signal and an inverting output signal, the first differential output signals making a transition responsive to a transition of the input signals, the first differential output signals having a predetermined magnitude relationship between a time of at least one of falling and rising transitions of the non-inverting output signal thereof and a time of the one of falling and rising transitions of the inverting output signal thereof; and a second differential circuit that differentially receives the input signals in common with the first differential circuit and generates second differential output signals comprising a non-inverting output signal and an inverting output signal, the second differential output signals making a transition responsive to a transition of the input signals, the second differential output signals having a magnitude relationship between a time of the one of falling and rising transitions of the non-inverting output signal thereof and a time of the one of falling and rising transitions of the inverting output signal thereof, the magnitude relationship of the second differential output signals being opposite to the magnitude relationship of the first differential output signals. A signal obtained by combining the non-inverting output signals of the first and second differential output signals and a signal obtained by combining the inverting output signals of the first and second differential output signals being produced respectively at first and second output terminals of the duty control buffer circuit.

According to the present invention, a problem that an output pulse vanishes during duty correction can be avoided.

Further, the present invention makes it possible to avoid a problem that duty deterioration occurs due to an offset of a differential circuit which differentially receives duty-corrected output signals.

Still other features and advantages of the present invention will become readily apparent to those skilled in this art from the following detailed description in conjunction with the accompanying drawings wherein only exemplary embodiments of the invention are shown and described, simply by way of illustration of the best mode contemplated of carrying out this invention. As will be realized, the invention is capable of other and different embodiments, and its several details are capable of modifications in various obvious respects, all without departing from the invention. Accordingly, the drawing and description are to be regarded as illustrative in nature, and not as restrictive.

BRIEF DESCRIPTION OF THE DRAWINGS

FIGS. 8A to 8C are timing waveform diagrams for explaining an operation example of the comparative example;

FIGS. 19A to 19H are timing waveform diagrams for explaining an operation of the example of the present invention.

PREFERRED MODES

Figure 1:
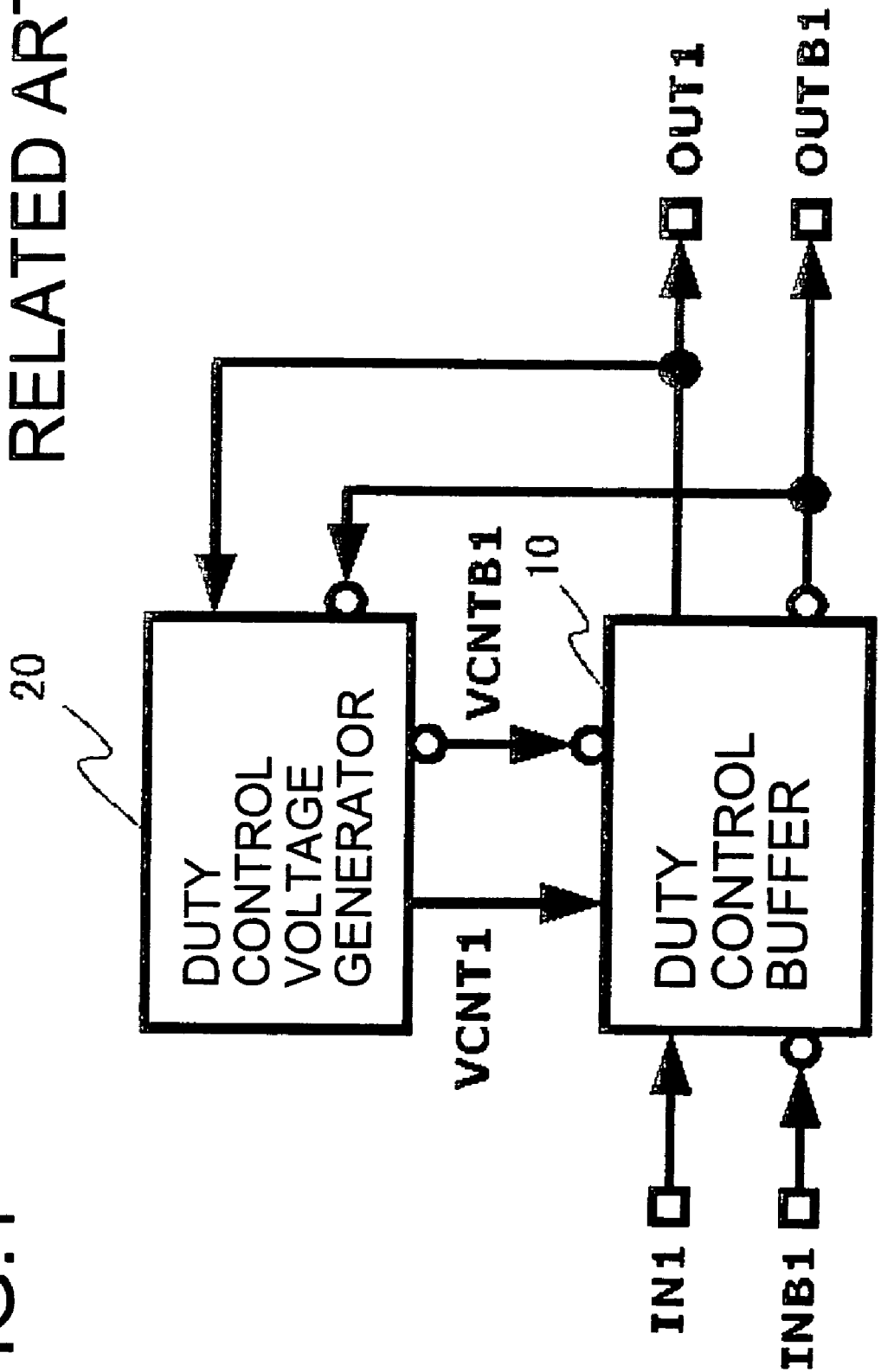
FIG. 1 is a diagram explaining a configuration of a duty correction circuit of a related art.

Exemplary embodiments of the present invention will be described. In the present invention, a duty control buffer that receives inputs signals (IN1, INB1) includes a first differential pair (NA1, NA2) and a second differential pair (NB1, NB2). The first differential pair (NA1, NA2) generates first differential output signals including a non-inverting output signal (OUT1) and an inverting output signal (OUTB1). The first differential output signals make a transition responsive to a transition of the input signals and have, with regard to at least one of falling and rising transitions thereof, a predetermined magnitude relationship between a time of the transition of the non-inverting output signal (OUT1) and a time of the transition of the inverting output signal (OUTB1). The second differential pair (NB1, NB2) receives the input signals, in common with the first differential pair. The second differential pair (NB1, NB2) generates second differential output signals including a non-inverting output signal and an inverting output signal. The second differential output signals make a transition responsive to a transition of the input signals. The second differential output signals have, with regard to at least one of falling and rising transitions thereof, a magnitude relationship between a time of the transition of the non-inverting output signal and a time of the transition of the inverting output signal. The magnitude relationship of the second differential output signal is opposite to the magnitude relationship of the first differential output signals. The duty control buffer outputs a signal waveform which is obtained by combining the non-inverting output signals of the first and second differential output signals and the inverting output signals of the first and second differential output signals. The duty control buffer includes a load element pair (RL11, RL12) connected between a power supply and output pairs connected in common between the first and second differential pairs, and a current source stage that supplies driving currents corresponding to control signals (VCNT1, VCNTB1) to the first and second differential pairs, respectively. The control signals are output from a duty correction voltage generator that receives the output signals OUT1/OUTB1 and generates voltages for duty correction. The control signals supply voltages corresponding to a duty error.

The first and second differential pairs operate as unbalanced differential pairs, in which current driving capabilities of transistor pairs are different, for example. When the first differential pair (NA1, NA2), with respect to an output falling transition thereof, delays a transition time of the non-inverting output signal (OUT1) as compared with a transition time of the inverting output signal (OUTB1), the second differential pair (NB1, NB2), with respect to an output rising transition thereof, delays a transition time of the non-inverting output signal as compared with a transition time of the inverting output signal.

Figure 2:
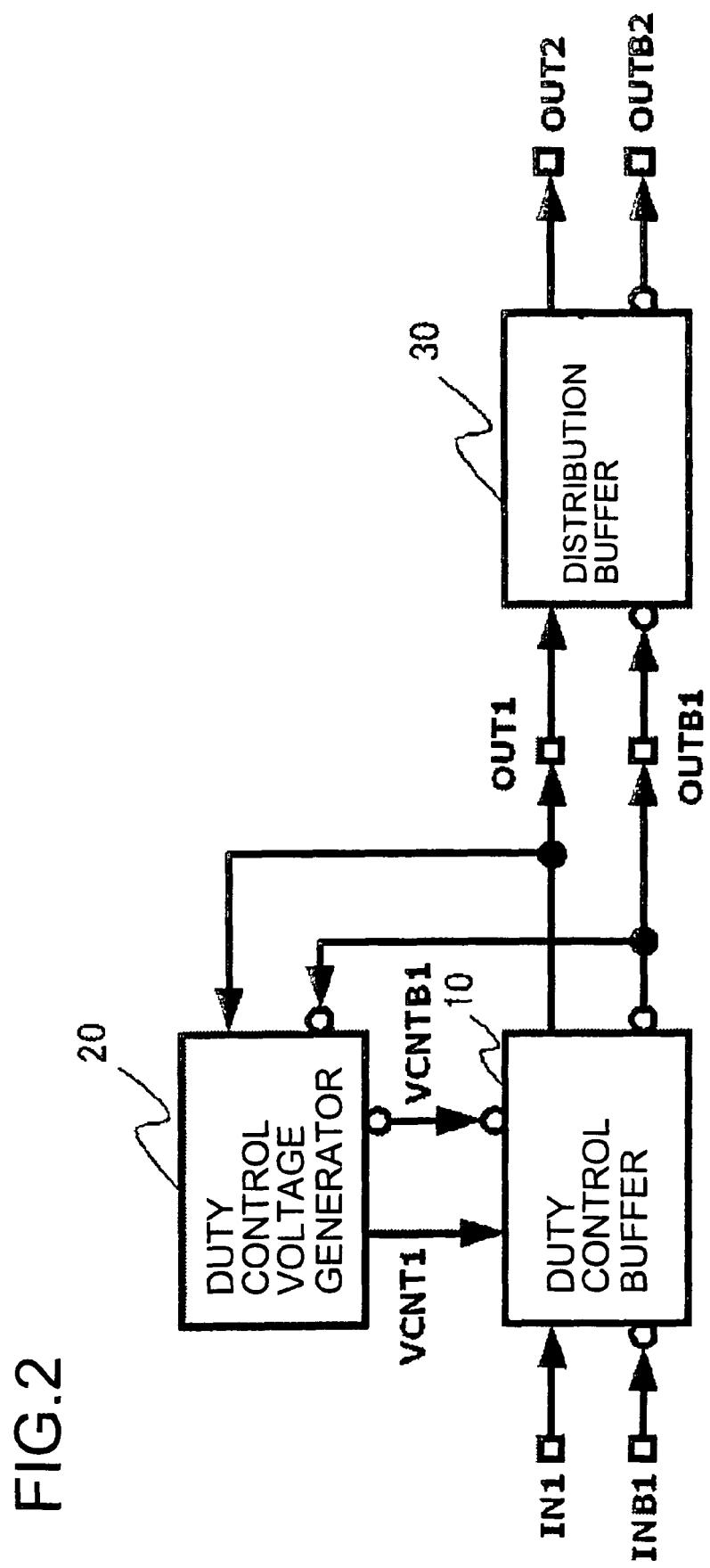
FIG. 2 is a diagram showing a configuration of a duty correction circuit to which the present invention is applied.

First, a comparative example of the present invention will be described. FIG. 2 is a diagram in which a distribution buffer 30 for signal distribution is connected to outputs of a duty control buffer 10 in FIG. 1. The distribution buffer 30 is not illustrated in Patent Document 1. The distribution buffer 30 differentially receives the outputs OUT1 and OUTB1 of the duty control buffer 10 and differentially supplies outputs OUT2 and OUTB2.

Figure 3:
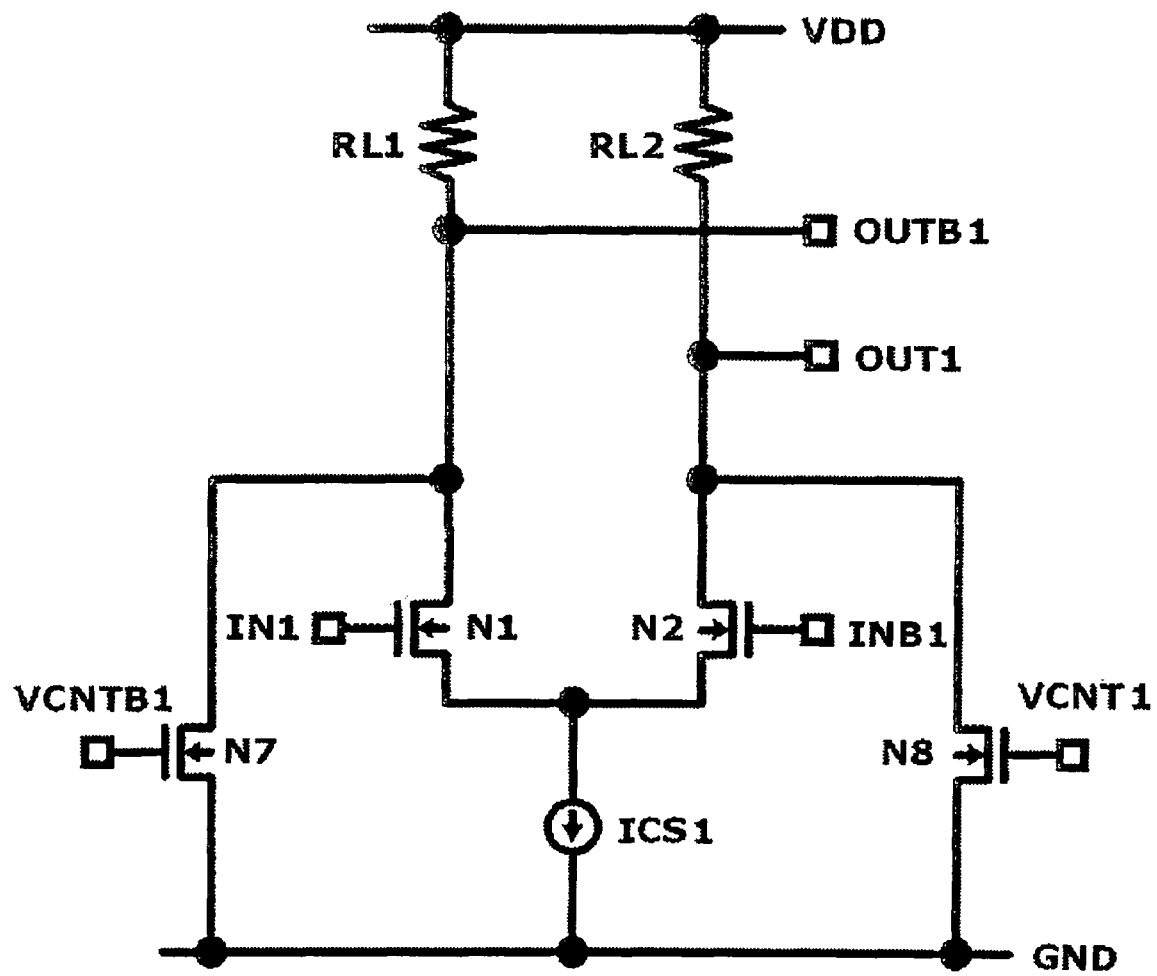
FIG. 3 is a diagram showing a configuration of a duty control buffer of a comparative example.

FIG. 3 shows a configuration example (comparative example) of the duty control buffer in FIG. 2. FIG. 3 is created by the inventor of the present invention for comparison with the present invention. Referring to FIG. 3, the duty control buffer of the comparative example includes a constant current source ICS1 with one terminal thereof connected to the GND (ground), NMOS transistors N1 and N2 having coupled sources connected to the other end of the constant current source ICS1 and having gates respectively connected to input terminals IN1 and INB1, resistors (load resistors) RL1 and RL2 (having same resistance values) respectively connected between drains of the NMOS transistors N1 and N2 and a power supply VDD, and NMOS transistors N7 and N8 having sources thereof connected in common to the GND, having drains respectively connected to the drains of the NMOS transistors N1 and N2, and having gates respectively connected to terminals VCNTB1 and VCNT1. A connection node of the resistor RL1 and the drains of the NMOS transistors N1 and N7 and a connection node of the resistor RL2 and the drains of the NMOS transistors N2 and N8 are respectively connected to output terminals OUTB1 and OUTB.

The NMOS transistors N1 and N2 compose a differential pair. An output OUT1 is in phase with an input IN1 and an output OUTB1 is in phase with an input INB1. That is, when the input IN1 is High and the input INB1 is Low, the output OUT1 is High and the output OUTB1 is Low. When the input IN1 is Low and the input INB1 is High, the output OUT1 is Low and the output OUTB1 is High.

The NMOS transistors N7 and N8 compose current sources connected to the load resistors RL1 and RL2, respectively. The NMOS transistor N7 varies an offset (amplitude center voltage) of the output OUTB1 in accordance with a value of a duty control voltage signal VCTB1 supplied to a gate of the NMOS transistor N7. The NMOS transistor N8 varies an offset (amplitude center voltage) of the output OUT1 in accordance with a value of a duty control voltage signal VCNT1 supplied to a gate of the NMOS transistor N8. When the input IN1 is High, the NMOS transistor N1 is turned on. Then, a current obtained by combining a drain current ID1 of the NMOS transistor N1 and a drain current ID7 of the NMOS transistor N7 that receives the signal VCNTB1 at the gate thereof flows through the resistor RL1. A voltage of VDD−RL1×(ID1+ID7) which is obtained by subtracting a voltage drop due to the resistor RL1 from the power supply voltage VDD appears as a Low-level output voltage (VOL) at the output terminal OUTB1.

When the input IN1 is Low, the NMOS transistor N1 is turned off. Then, the drain current ID7 of the NMOS transistor N7 that receives the signal VCNTB1 flows through the resistor RL1. Then, a voltage of VDD−RL1×ID7, which is obtained by subtracting a voltage drop due to the resistor RL1 from the power supply voltage VDD, appears as a High-level output voltage (VOH) at the output terminal OUTB1.

When the input INB1 is High, the NMOS transistor N2 is turned on. Then, a current which is obtained by combining a drain current ID2 of the NMOS transistor N2 and a drain current ID8 of the NMOS transistor N8 that receives the signal VCNT1 at the gate thereof flows through the resistor RL2. A voltage of VDD−RL2×(ID2+ID8), which is obtained by subtracting a voltage drop due to the resistor RL2 from the power supply voltage VDD, appears as a Low-level output voltage (VOL) at the output terminal OUT1.

When the input INB1 is Low, the NMOS transistor N2 is turned off. Then, the drain current ID8 of the NMOS transistor N8 that receives the signal VCNT1 at the gate thereof flows through the resistor RL2. Then, a voltage of VDD RL2×ID8, which is obtained by subtracting a voltage drop due to the resistor RL2 from the power supply voltage VDD, appears as a High-level output voltage (VOH) at the output terminal OUT1.

The following voltages appear at the output terminal OUT1 as the high-level output voltage (VOH) and the low-level output voltage (VOL):

$$VOH=VDD-RL2\times(ID8)$$

$$VOL=VDD-RL2\times(ID2+ID8)$$

The following voltages appear at the output terminal OUTB1 as the high-level output voltage (VOH) and the low-level output voltage (VOL):

$$VOH=VDD-RL1\times(ID7)$$

$$VOL=VDD-RL1\times(ID1+ID7)$$

A drain current (drain-to-source current) ID of an MOS transistor is, for example, given by:

$$ID = \frac{\beta}{2}(V_{GS} - V_{TH})^2$$

where β is a gain coefficient, VGS is a gate-to-source voltage, and VTH is a threshold value.

When a difference voltage ΔV between the High-level and Low-level output voltages VOH and VOL, indicated as ΔV=VOH−VOL and a center voltage VC=(VOH+VOL)/2 are used, the High-level output voltage VOH and the Low-level output voltage VOL of an output are expressed as follows.

$$VOH=VC+\Delta V/2$$

$$VOL=VC-\Delta V/2$$

The duty control buffer 10 converts a difference voltage between the duty control voltage signals VCNT1 and VCNTB1 to a difference voltage between a center voltage VC (OUT1) of the output OUT1 and a center voltage VC (OUTB1) of the output OUTB1. That is, an offset is given to each of the outputs OUT1 and OUTB1, corresponding to an associated one of duty control voltage values of the duty control voltage signals VCNT1 and VCNTB1.

When a difference voltage is generated between the respective center voltages VC of the outputs OUT1 and OUTB1, waveform blunting (during a rise or fall time) of the respective outputs OUT1 and OUTB1 causes a point (timing) at which the outputs OUT1 and OUTB1 cross each other on a time axis to vary. Thus, feedback control is performed in the duty control buffer 10 and a duty control voltage generator 20 until the outputs OUT1 and OUTB1 have the same duty, or until there is no potential difference between the signals VCNT1 and VCNTB1.

(a) In case of VCNTB1>VCNT1, the drain current ID7 of the NMOS transistor N7 is larger than the drain current ID8 of the NMOS transistor N8. Accordingly, a voltage drop of the resistor RL1 due to the drain current ID7 becomes larger than a voltage drop of the resistor RL2 due to the drain current ID8. The High-level output voltage VOH of the output OUTB1 becomes lower than the High-level output voltage VOH of the output OUT1. Further, the Low-level output voltage VOL of the output OUTB1 becomes lower than the Low-level output voltage VOL of the output OUT1. That is, the center voltage VC (OUTB1) of the output OUTB1 becomes lower than the center voltage VC (OUT1) of the output OUT1.

(b) In case of VCNTB1<VCNT1, the drain current ID8 of the NMOS transistor N8 is larger than the drain current ID7 of the NMOS transistor N7. Accordingly, a voltage drop of the resistor RL2 due to the drain current ID8 becomes larger than a voltage drop of the resistor RL1 due to the drain current ID7. The High-level output voltage VOH of the output OUTB1 becomes higher than the High-level output voltage VOH of the output OUT1. Further, the Low-level output voltage VOL of the output OUTB1 becomes higher than the Low-level output voltage VOL of the output OUT1. That is, the center voltage VC (OUTB1) of the output OUTB1 becomes higher than the center voltage VC (OUT1) of the output OUT1.

Figure 4:
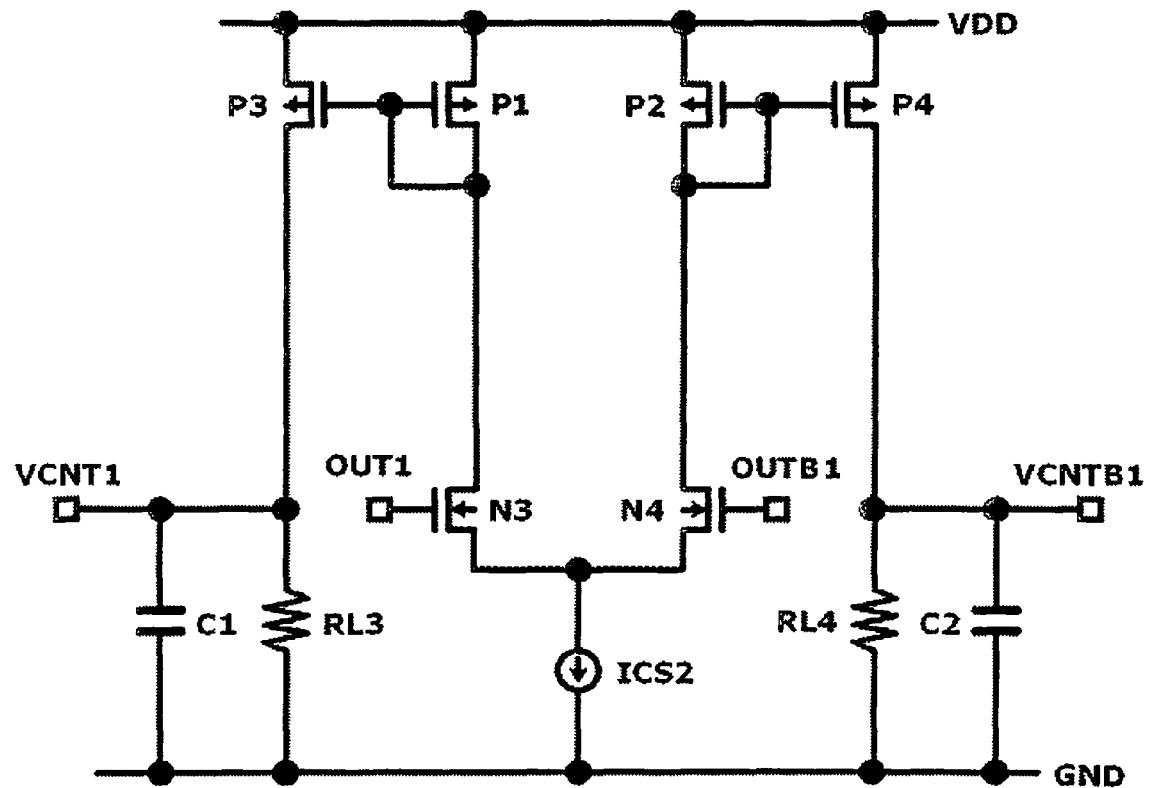
FIG. 4 is a diagram showing a configuration of a duty control voltage generator in FIG. 2.

FIG. 4 is a diagram showing a configuration example of the duty control voltage generator 20 in FIG. 2. The duty control voltage generator 20 integrates respective potentials of the signals OUT1 and OUTB1. Then, a deterioration of duty (which is a difference between respective time periods (time widths) of a High level and a Low level) is converted to a potential difference between the duty control signal VCNT1 and the duty control signal VCNTB1. The duty control voltage generator 20 includes a constant current source ICS2 having one end connected to the GND, NMOS transistors N3 and N4 having coupled sources connected to the other end of the constant current source ICS2 and having gates respectively connected to the terminals OUT1 and OUTB1, PMOS transistors P1, P2, P3, and P4, a capacitor C1 and a resistor RL3, and a capacitor C2 and a resistor RL4. A source of the PMOS transistor P1 is connected to a power supply VDD. A drain and a gate of the PMOS transistor P1 are connected. A connection node of the drain and the gate of the PMOS transistor P1 is connected to a drain of the NMOS transistor N3. A source of the PMOS transistor P2 is connected to the power supply VDD. A drain and a gate of the PMOS transistor P2 are connected. A connection node of the drain and the gate of the PMOS transistor P2 is connected to a drain of the NMOS transistor N4. A source of the PMOS transistor P3 is connected to the power supply VDD. A gate of the PMOS transistor P3 is connected to the gate of the PMOS transistor P1. A source of the PMOS transistor P4 is connected to the power supply VDD. A gate of the PMOS transistor P4 is connected to the gate of the PMOS transistor P2. The capacitor C1 and the resistor RL3 are connected in parallel between a drain of the PMOS transistor P3 and the GND. The capacitor C2 and the resistor RL4 are connected in parallel with a drain of the PMOS transistor P4 and the GND. Capacitance values of the capacitors C1 and C2 are equal, and resistance values of the resistor RL3 and RL4 are equal. The PMOS transistors P1 and P3 compose a first current mirror. A mirror current of a drain current of the NMOS transistor N3 flows through the resistor RL3 from the drain of the PMOS transistor P3. The PMOS transistors P2 and P4 compose a second current mirror. A mirror current of a drain current of the NMOS transistor N4 flows through the resistor RL4 from the drain of the PMOS transistor P4. A terminal voltage of the capacitor C1 that stores a voltage between terminals of the resistor RL3 and a terminal voltage of the capacitor C2 that stores a voltage between terminals of the resistor RL4 are supplied as a first duty control voltage in the form of the voltage VCNT1 and a second duty control voltage in the form of the voltage VCNT2 for the duty control buffer 10.

When a High-level period of the output OUT1 is longer than a High-level period of the output OUTB1 (Low-level period of the output OUT1) (i.e., duty >50%), an integration result corresponding to a difference between the High-level periods of the outputs OUT1 and OUTB1 is generated between the voltages VCNT1 and VCNTB1. The duty control voltage VCNT1 then becomes larger than the duty control voltage VCNTB1. As described above, when the duty control voltage VCNT1 is larger than the duty control voltage VCNTB1, the center voltage of the output OUTB1 of the duty control buffer 10 (refer to FIG. 2) becomes higher than the center voltage of the output OUT1. That is, due to an increase in the voltage drop of the resistor RL2, the High-level output voltage and the Low-level output voltage of the output OUT1 are both lowered. Due to a reduction in the voltage drop of the resistor RL1, the High-level output voltage and the Low-level output voltage of the output OUTB1 are both raised. For this reason, a potential difference between the High level of the output OUTB1 and the Low level of the output OUT1 is increased, and a potential difference between the High level of the output OUT1 and the Low level of the output OUTB1 is reduced. A period from an intersection between a fall of the output OUT1 and a rise of the output OUTB1 to an intersection between a rise of the output OUT1 and a fall of the output OUTB1 is extended on the time axis. Then, a period from the intersection between the rise of the output OUT1 and the fall of the output OUTB1 to an intersection between a fall of the output OUT1 and a rise of the output OUTB1 is narrowed on the time axis.

On the other hand, when the High-level period of the output OUT1 is shorter than the High-level period of the output OUTB1 (Low-level period of the output OUT1) (i.e., duty <50%), an integration result corresponding to a difference between the High-level periods of the outputs OUT1 and OUTB1 is generated between the voltages VCNT1 and VCNTB1. The voltage VCNTB1 becomes larger than the voltage VCNT1. As described above, when the voltage VCNTB1 is larger than the voltage VCNT1, the center voltage of the output OUTB1 becomes lower than the center voltage of the output OUT1. That is, the High-level output voltage and the Low-level output voltage of the output OUTB1 are both lowered. The High-level output voltage and the Low-level output voltage of the output OUT1 are both raised. For this reason, a potential difference between the High level of the output OUTB1 and the Low level of the output OUT1 is reduced, and a potential difference between the High level of the output OUT1 and the Low level of the output OUTB1 is increased. A period from an intersection between a fall of the output OUT1 and a rise of the output OUTB1 to an intersection between a rise of the output OUT1 and a fall of the output OUTB1 is narrowed on the time axis. Then, a period from the intersection between the rise of the output OUT1 and the fall of the output OUTB1 to an intersection between a fall of the output OUT1 and a rise of the output OUTB1 is extended on the time axis.

Figure 5:
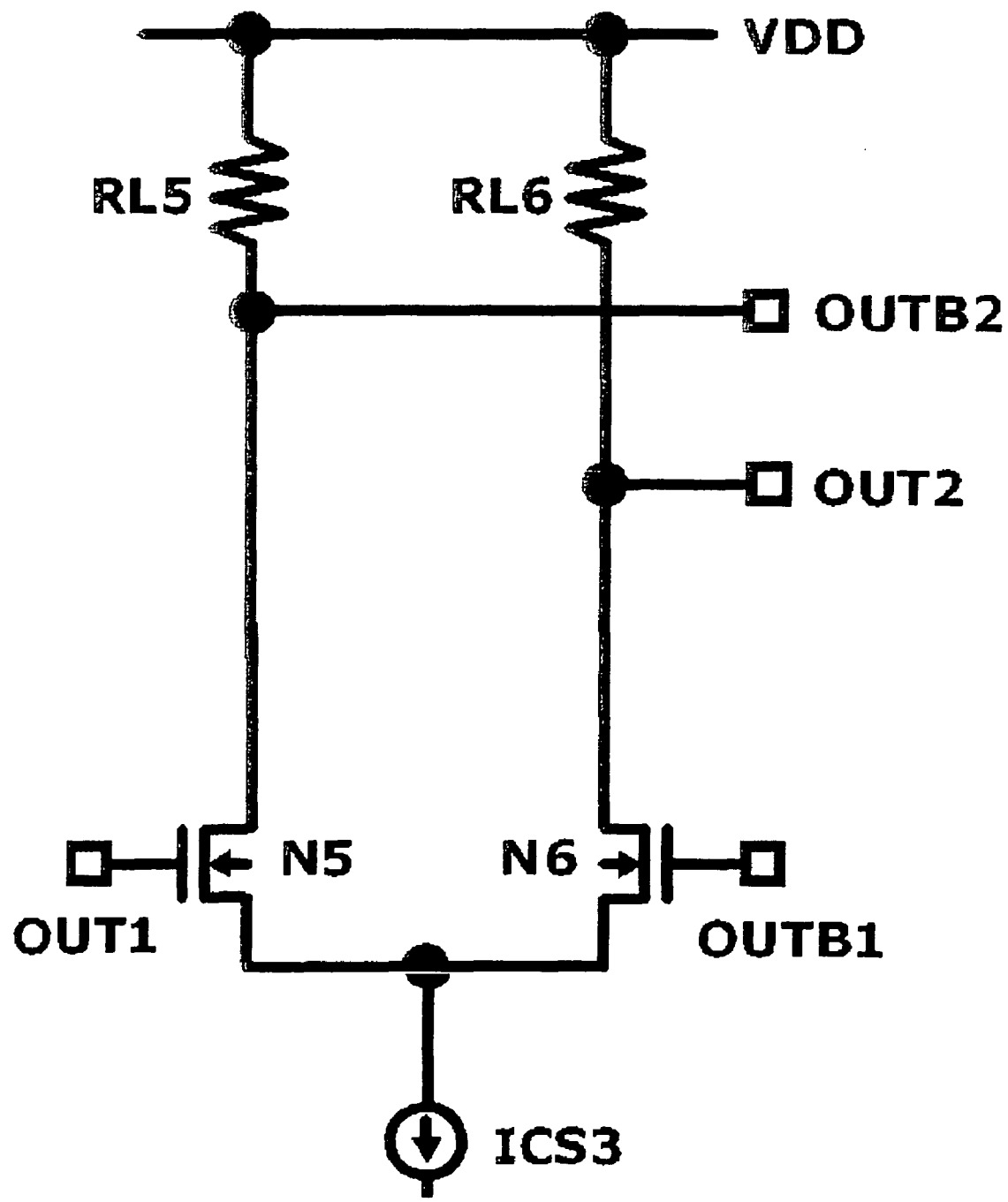
FIG. 5 is a diagram showing a configuration of a distribution buffer in FIG. 2.

FIG. 5 is a diagram showing a configuration example of the distribution buffer 30 in FIG. 2. Referring to FIG. 5, the distribution buffer 30 includes a constant current source ICS3 having one end connected to the GND, NMOS transistors N5 and N6 having coupled sources connected to the other end of the constant current source ICS3, and resistors RL5 and RL6 (load resistances of a differential pair) connected between drains of the NMOS transistors N5 and N6 and the power supply VDD. The outputs OUT1 and OUTB1 are supplied to gates of the NMOS transistors N5 and N6. The NMOS transistors N5 and N6 compose a differential pair. When a voltage of the output OUT1 exceeds a threshold voltage of the NMOS transistor N5 and when a voltage of the output OUTB1 is equal to or less than the threshold voltage of the NMOS transistor N5, the NMOS transistor N5 is turned on, the NMOS transistor N6 is turned off, the output OUT2 goes High, and the output OUTB2 goes Low. When the voltage of the output OUT1 is equal to or less than the threshold voltage of the NMOS transistor N5 and when the voltage of the output OUTB1 exceeds the threshold voltage of the NMOS transistor N5, the NMOS transistor N5 is turned off, the NMOS transistor N6 is turned on, the output OUT2 goes Low, and the output OUTB2 goes High.

FIGS. 6A to 6D and FIGS. 7A to 7D respectively show waveforms of respective nodes in a duty correction circuit of the comparative example described with reference to FIGS. 2 through 5 when duties of input waveforms have not deteriorated and when the duties of the input waveforms have deteriorated.

Figure 6A:
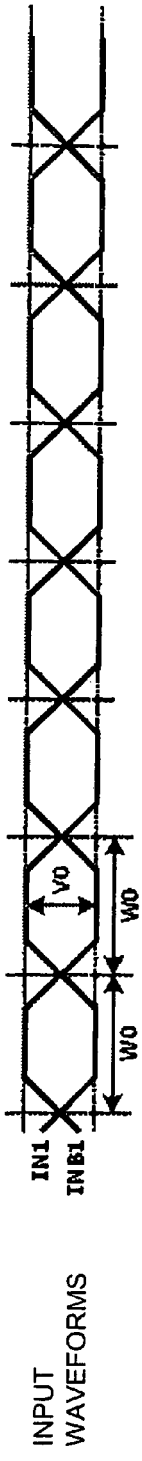
FIGS. 6A to 6D are timing waveform diagrams for explaining an operation example of the comparative example.
Figure 6B:
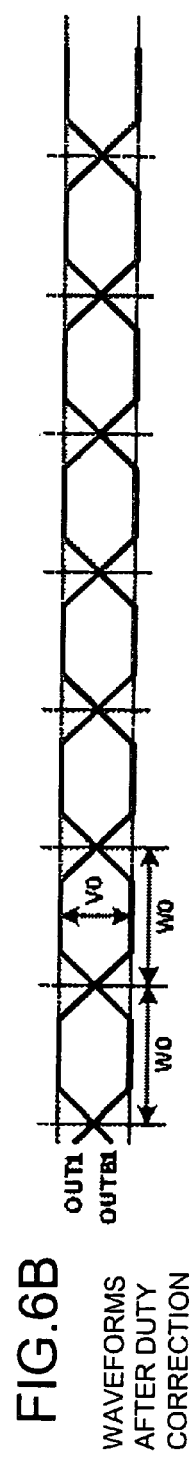
Figure 6C:
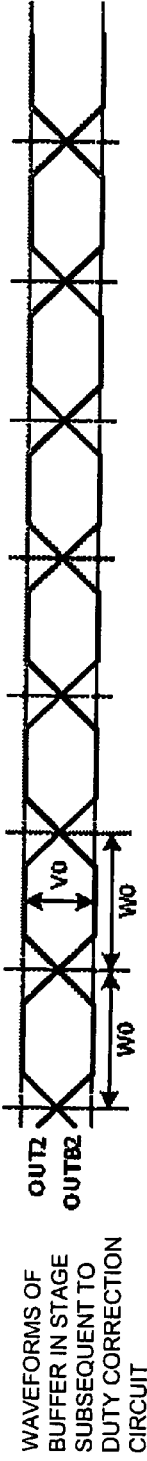
Figure 6D:

In the waveform diagrams in FIGS. 6A, 6B, 6C, and 6D, FIG. 6A shows voltage waveforms of the input signals IN1 and INB1, FIG. 6B shows voltage waveforms of the outputs OUT1 and OUTB1 of the duty control buffer 10, voltage waveforms of the outputs OUT2 and OUTB2 of the distribution buffer 30, and voltage waveforms of the duty control voltages VCNT1 and VCNTB1, in the configuration in FIG. 2 when the duty of each of the input signals IN1 and INB1 is 50%. When the duty of each of the input signals IN1 and INB1 is 50%, the duty control voltages VCNT1 and VCNTB1 are made to be a same voltage V0. Center voltages of the outputs OUT1 and OUTB1 of the duty control buffer 10 are equal. Then, a period from an intersection between a fall of the output OUT1 and a rise of the output OUTB1 on the time axis to an intersection between a rise of the output OUT1 and a fall of the output OUTB1 on the time axis becomes equal to a period from the intersection between the rise of the output OUT1 and the fall of the output OUTB1 on the time axis to an intersection between a fall of the output OUT1 and a rise of the output OUTB1 on the time axis. Thus, the duty becomes 50%.

The waveform diagrams in FIGS. 7A to 7D are diagrams when a High-level period (W2) of the input IN1 is longer than a Low-level period (W1) of the input IN1 (and a Low-level period of the output OUTB1 is shorter than a High-level period of the output OUTB1) (which means that the duty of the input IN1 is larger than 50%). Since the output OUT1 of the duty control buffer 10 in FIG. 3 is in phase with the input IN1 and the output OUTB1 is in phase with the input INB1, the duty of the output OUT1 becomes larger than 50%. A time difference (W2−W1) between a High-level period and a Low-level period of the output OUT1 is converted to a potential difference between the duty control voltages CNT1 and VCNTB1. Then, the duty control voltage VCNT1 becomes equal to a voltage V1 which is larger than the voltage V0. The duty control voltage VCNTB1 becomes equal to a voltage V2 which is smaller than V0.

In the duty control buffer 10 (refer to FIG. 2) that receives the duty control voltages VCNT1 and VCNTB1, a High-level voltage, a Low-level voltage, and a center voltage of the output OUT1 are reduced. Then, a High-level voltage, a Low-level voltage, and a center voltage of the output OUTB1 are increased.

A time width from a cross-point between a fall of the output OUT1 and a rise of the output OUTB1 to a cross-point between a rise of the output OUT1 and a fall of the output OUTB1 is extended from W1 to W0. A time width between the cross-point from the rise of the output OUT1 and the fall of the output OUTB1 to a cross-point between a fall of the output OUT1 and a rise of the output OUTB1 is narrowed from W2 to W0.

A High-level period and a Low-level period of each of the differential (complementary) outputs OUT2 and OUTB2 of the distribution buffer 30 that receives the outputs OUT1 and OUT1B both become W0. Then, each duty of the differential outputs OUT2 and OUTB2 both becomes 50%. For simplicity, immediately below each cycle of the waveform of the input IN1 of which the duty is larger than 50%, the waveforms OUT1 and OUTB1 and the waveforms OUT2 and OUTB2 after duty correction, each of which the duty is 50%, are respectively illustrated (within the same cycle). Feedback control using the duty control voltages VCNT1 and VCNTB1 that indicates an integration result of the duty control voltage generator 20 is generally performed over a plurality of cycles. Further, referring to FIGS. 7A to 7D, the control is performed so that the duty control voltage VCNT1 is made larger than the duty control voltage VCNTB1 and the duty of the output OUT1 is 50%. As the outputs OUT1 and OUTB2 and OUT2 and OUTB2 get close to duty=50%, voltage values of the duty control voltages VCNT1 and VCNTB1 change so that the voltage values become equal. Then, when the duty becomes 50%, the duty control voltage VCNT1 becomes equal to the duty control voltage VCNTB1.

In the comparative example described with reference to FIGS. 2 through 5, when each of a rise time and a fall time of the respective outputs OUT1 and OUTB1 is small, duty correction cannot be made, even if a difference between center voltages of the outputs OUT1 and OUTB1 is increased using the duty control voltages VCNT1 and VCNTB1 as shown in FIG. 8. A potential difference between the center voltages of the outputs OUT1 and OUTB1 may vary to a state in which respective edges of the outputs OUT1 and OUTB1 cannot be crossed. In FIG. 8, the High-level period (W2) of the input IN1 is longer than the Low-level period (W1) of the input IN1 (which means that the duty is larger than 50%), as in FIG. 7. A time difference (W2−W1) between the High-level period and the Low-level period of each of the outputs OUT1 and OUTB1 is converted to a potential difference between the voltages VCNT1 and VCNTB1 at the duty control voltage generator 20. As a result, the voltage VCNT1 becomes larger than the voltage VCNTB1. In the duty control buffer 10 (refer to FIG. 2) that receives the voltages VCNT1 and VCNTB1, the center voltage of the output OUT1 is reduced, and the center voltage of the output OUTB1 is increased. Then, the Low-level output voltage VOL of the output OUTB1 is higher than the High-level output voltage VOH of the output OUT1. For this reason, a fall of the output OUT1 does not cross a rise of the output OUTB1 on the time axis. Further, a rise of the output OUT1 does not cross a fall of the output OUTB1 on the time axis. As a result, the output OUTB2 of the distribution buffer 30 is fixed at the High level, and the output OUT2 of the distribution buffer is fixed at the Low level. Then, the signals (clock pulse waveforms) vanish.

Figure 7A:
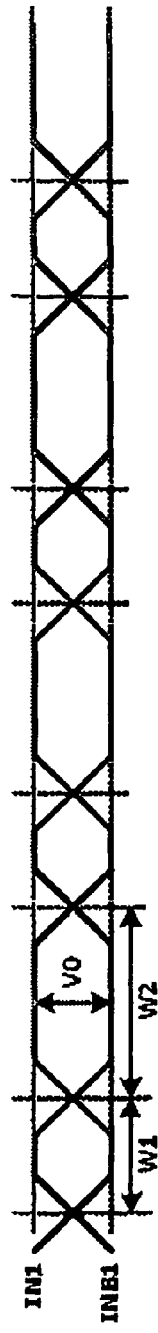
FIGS. 7A to 7D are timing waveform diagrams for explaining an operation example of the comparative example.
Figure 7B:
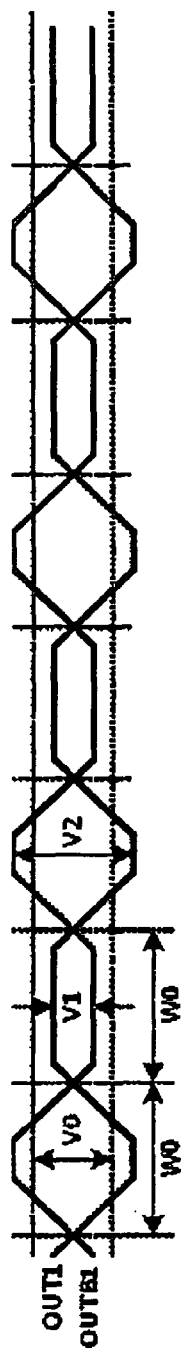
Figure 7C:
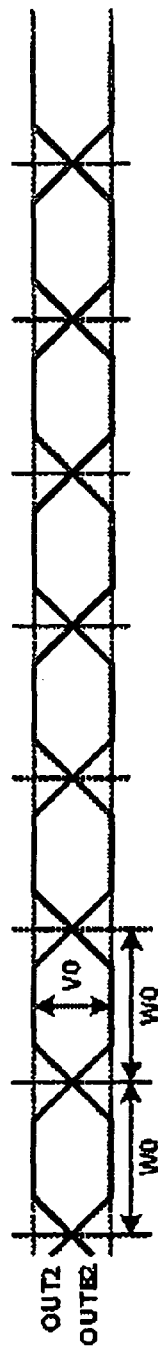
Figure 7D:
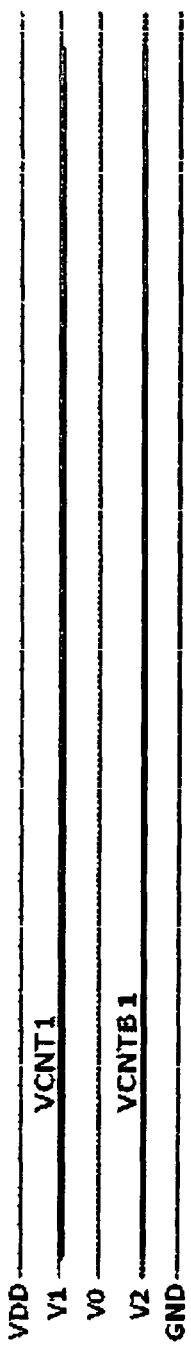

High-level and Low-level amplitudes of each of the outputs OUT1 and OUTB1 are made unbalanced due to duty correction, as shown in FIG. 7B. These outputs OUT1 and OUTB1 are supplied to the distribution buffer 30. Generally, in the buffer circuit of a differential type shown in FIG. 5, threshold values of the NMOS transistors N5 and N6, for example, may vary due to a fabrication process variation or the like. Signal detecting capability of the buffer circuit of the differential type may vary due to the threshold value variation, and capability of detecting a High level from a Low level may deteriorate more than capability of detecting a Low level from a High level. In the in-phase buffer (that respectively outputs in-phase High-level outputs OUT2 and OUT2B with respect to High-level outputs OUT1 and OUTB1 and respectively outputs in-phase Low-level outputs OUT2 and OUT2B with respect to Low-level outputs OUT1 and OUTB1), a speed of outputting the High-level becomes slower than a speed of outputting the Low-level. This generates duty deterioration.

Figure 9A:
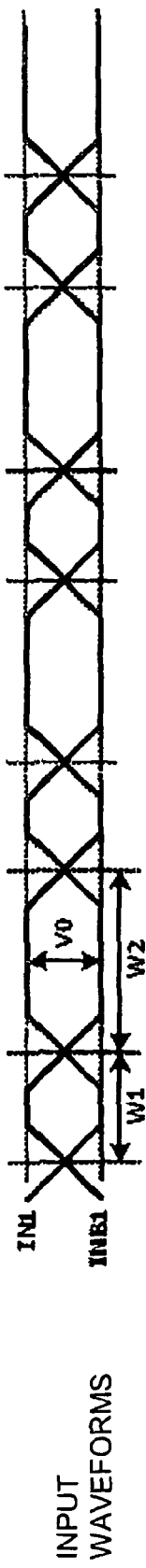
FIGS. 9A to 9C are timing waveform diagrams for explaining an operation example of the comparative example.
Figure 9B:
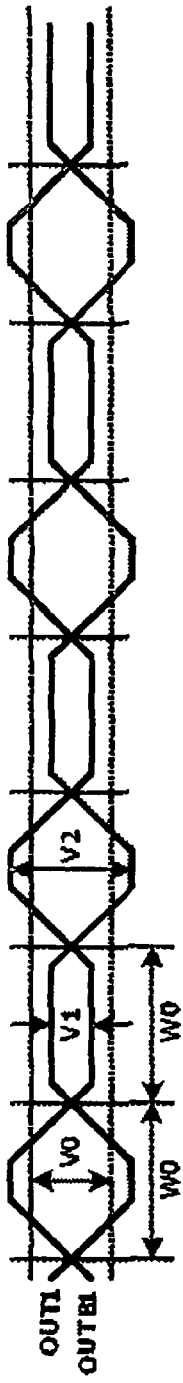
Figure 9C:
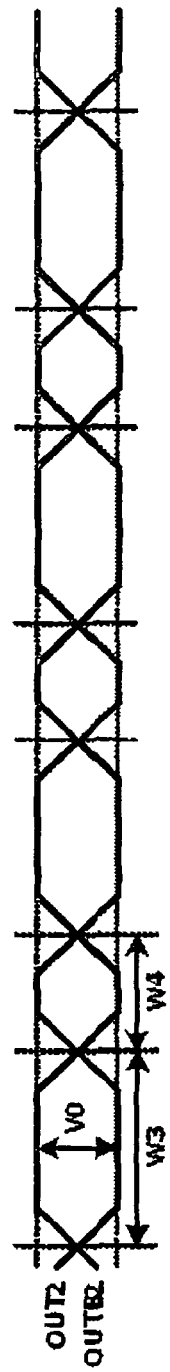

FIGS. 9A to 9C are diagrams showing timing waveforms in this case. In FIG. 9A, the High-level period (W2) of the input IN1 is longer than the Low-level period (W1) of the input IN1, (which means that the duty is larger than 50%), as in FIG. 7A. In the duty control voltage generator 20, a time difference (W2−W1) between High-level and Low-level periods of each of the outputs OUT1 and OUTB1 is converted to a potential difference between the control voltages VCNT1 and VCNT2. The output OUT1 is in phase with the input IN1, and the output OUTB1 is in phase with the input INB1. High-level and Low-level amplitudes of each of the outputs OUT1 and OUTB1 are made unbalanced due to duty correction. Assume, for example, that, in the distribution buffer 30 that differentially receives the outputs OUT1 and OUTB1, capability of detecting the High level deteriorates with respect to capability of detecting the Low level, due to a variation in manufacturing process, as described above. Then, a speed of outputting the High level is delayed more than a speed of outputting the Low level. Thus, duty-distorted signals are output from the outputs OUT2 and OUTB2 of the distribution buffer 30 (refer to FIG. 9C). The amplitude of the output OUT1 of the duty control buffer 10 when the output OUT1 is high and the amplitude of the output OUTB1 of the duty control buffer 10 when the output OUTB1 is low are reduced. Then, due to a differential pair offset of the distribution buffer 30 in a subsequent stage, the duty of each of the outputs OUT1 and OUTB2 that has been corrected to 50% by the duty control buffer 10 is varied again. That is, a High-level period of the output OUT2 is reduced to W4 from W0, and a Low-level period of the output OUT2 is extended to W3 from W0. Then, the duty of the output OUT2 becomes W4/(W3+W4). This duty variation is caused by reduction of a difference voltage between the High level of the output OUT1 and the Low level of the OUTB1 by the duty control buffer 10.

When waveform blunting of the outputs OUT1 and OUTB1 is small in the comparative example, duty correction cannot be completely made even if a difference between the center voltages of the outputs OUT1 and OUTB1 is increased. The clock pulse vanishes. Further, due to an offset of the buffer in the subsequent stage, the duty of each of the outputs OUT1 and OUTB1 that has been corrected to 50% may be varied again. The above description was given about the problems of the comparative example in detail. Exemplary embodiments of the present invention will be described below.

The present invention is adapted to prevent reduction of duty correction capability and a malfunction that are generated due to a change in waveform blunting of signals in a duty correction circuit. Further, duty deterioration that occurs due to an offset of a differential circuit generated by fabrication variation or the like is significantly reduced. A configuration of an example of the present invention will now be described. The duty correction circuit of the present invention includes a duty control buffer 10, a duty control voltage generation unit 20 and a distribution buffer 30 as shown in FIG. 2. The duty control voltage generation unit 20 and the distribution buffer 30 have the configurations shown in FIGS. 4 and 5, respectively.

Figure 10:
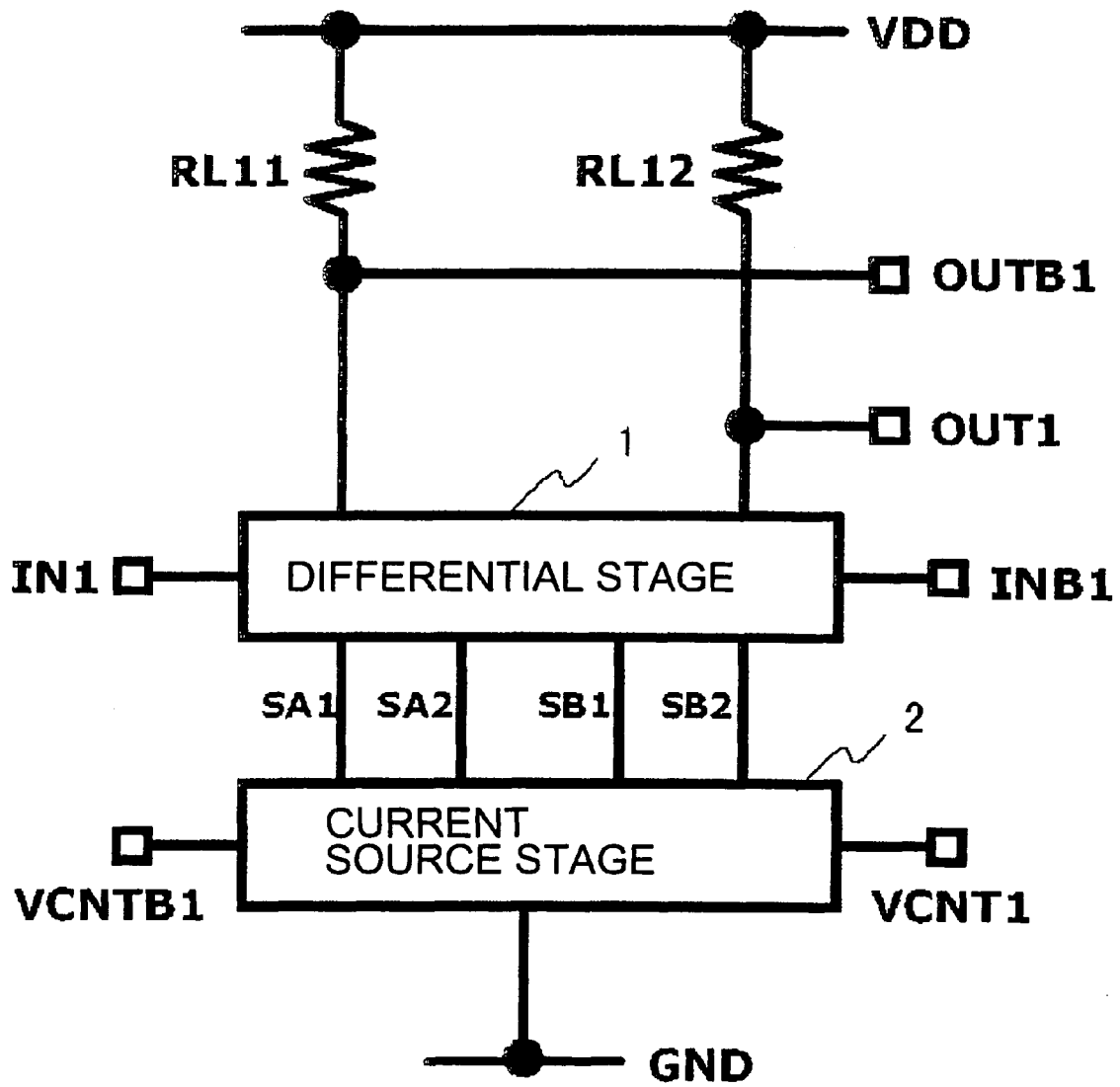
FIG. 10 is a diagram showing a configuration of a duty control buffer in an example of the present invention.

FIG. 10 is a diagram showing a configuration of the duty control buffer 10 in an example of the present invention. Referring to FIG. 10, this duty control buffer includes a differential stage 1 that has an input pair connected to input terminals IN1 and INB2 and has an output pair connected to a power supply VDD via load resistors RL1 and RL2, respectively, and a current source stage 2. The current source stage 2 which is connected between the differential stage 1 and the GND, receives duty control voltages VCNTB1 and VCNT1. The current source stage 2 supplies currents from current terminals SA1, SA2, SB1, and SB2 to the differential stage 1. A connection node between the resistor RL1 and one of an output pair of the differential stage 1 and a connection node between the resistor RL2 and the other of the output pair of the differential stage 1 are respectively connected to an output terminal OUTB1 and an output terminal OUT1.

Figure 11:
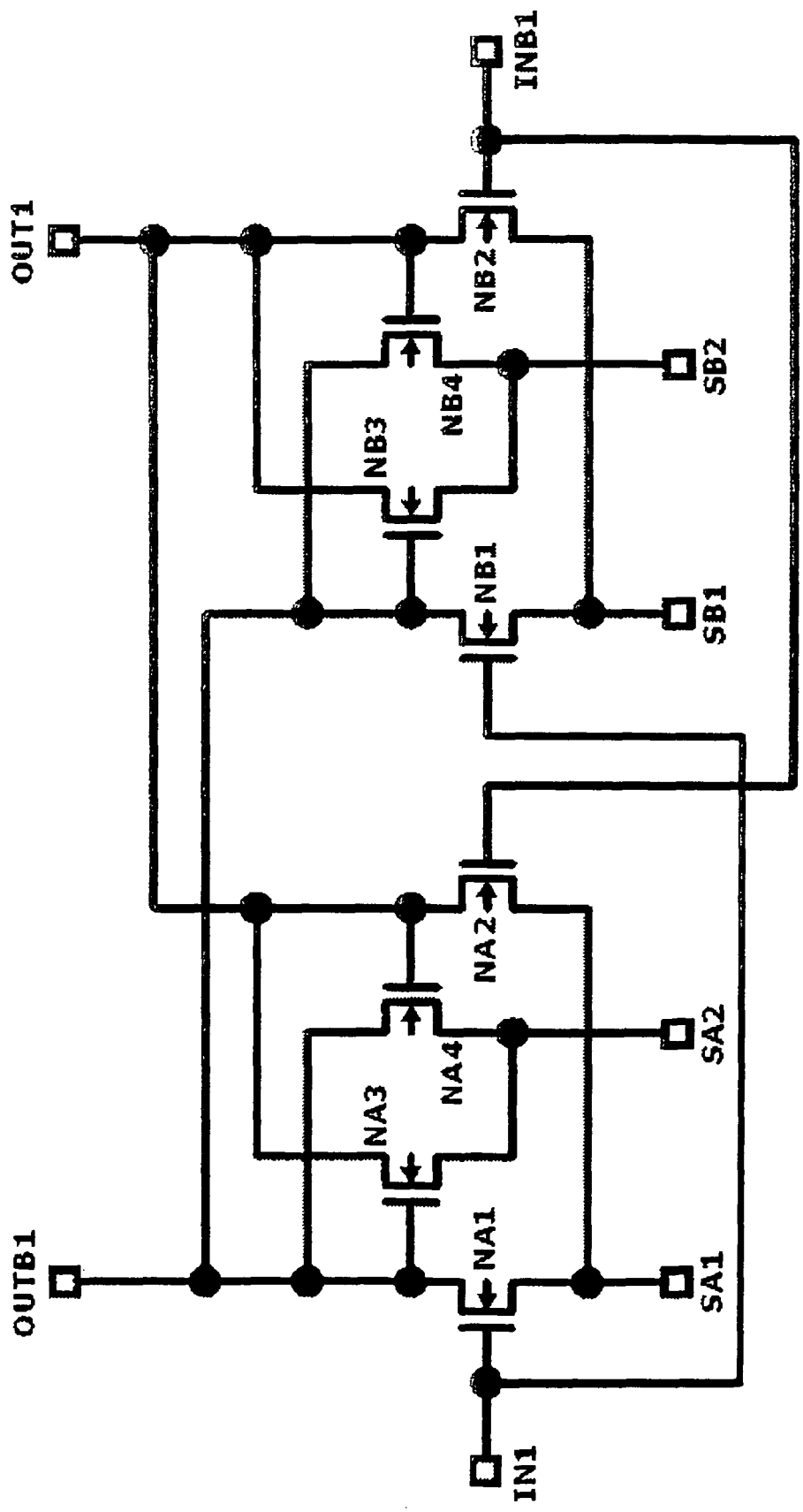
FIG. 11 is a diagram showing an example of a configuration of a differential stage (Differential stage) in FIG. 10.

FIG. 11 is a diagram showing an example of a configuration of the differential stage 1 in FIG. 10. Referring to FIG. 11, this differential stage includes NMOS transistors NA1 and NA2, NMOS transistors NA3 and NA4, NMOS transistors NB1 and NB2, and NMOS transistors NB3 and NB4. The NMOS transistors NA1 and NA2 have coupled sources connected to a current terminal SA1, have gates respectively connected to the input terminals IN1 and INB1, and gave drains respectively connected to the output terminals OUTB1 and OUT1. The NMOS transistors NA3 and NA4 have coupled sources connected to a current terminal SA2, have gates respectively connected to the output terminals OUTB1 and OUT1, and have drains respectively connected to the output terminals OUT1 and OUTB1. The NMOS transistors NB1 and NB2 have coupled sources connected to a current terminal SB1, have gates respectively connected to the input terminals IN1 and INB1, and have drains respectively connected to the output terminals OUTB1 and OUT1. The NMOS transistors NB3 and NB4 have coupled sources connected to a current terminal SB2, have gates respectively connected to the output terminals OUTB1 and OUT1, and drains respectively connected to the output terminals OUT1 and OUTB1.

Each of the NMOS transistors NA3 and NA4 functions as a latch circuit. When the output terminal OUTB1 is High, the NMOS transistor NA3 is turned on to set the output terminal OUT1 to a Low level. When the output terminal OUT1 is High, the NMOS transistor NA4 is turned on to set driving the output terminal OUTB1 to a Low level. Each of the NMOS transistors NB3 and NB4 also functions as a latch circuit. When the output terminal OUTB1 is High, the NMOS transistor NB3 is turned on to set the output terminal OUT1 to a Low level. When the output terminal OUT1 is High, the NMOS transistor NB4 is turned on to set the output terminal OUTB1 to a Low level.

Assuming that a ratio W/L (gate width/gate length) of each of the NMOS transistors NA2 and NA3 is one (unit), a ratio W/L of each of the NMOS transistors NA1 and NA4 is made n times (in which n is larger than one). A current driving capability of the NMOS transistor NA2 of driving the output terminal OUT1 from High to Low is therefore set to (1/n) times of a current driving capability of the NMOS transistor NA1 of driving the output terminal OUTB1 from High to Low. In a circuit including the NMOS transistors NA1 to NA4, a fall time (transition time from High to Low) of the output terminal OUT1 is more delayed than a fall time (transition time from High to Low) of the output terminal OUTB1.

When a ratio W/L (gate width/gate length) of each of the NMOS transistors NB1 and NB4 is set to one (unit), a ratio W/L of each of the NMOS transistors NB2 and NB3 is set to m times (in which m is larger than one). A current driving capability of the NMOS transistor NB1 of driving the output terminal OUTB1 from High to Low is therefore set to (1/m) times a current driving capability of the NMOS transistor NB2 of driving the output terminal OUT1 from High to Low. In a circuit including the NMOS transistors NB1 to NB4, a fall time (transition time from High to Low) of the output terminal OUTB1 is more delayed than a fall time (transition time from High to Low) of the output terminal OUT1.

Figure 12:
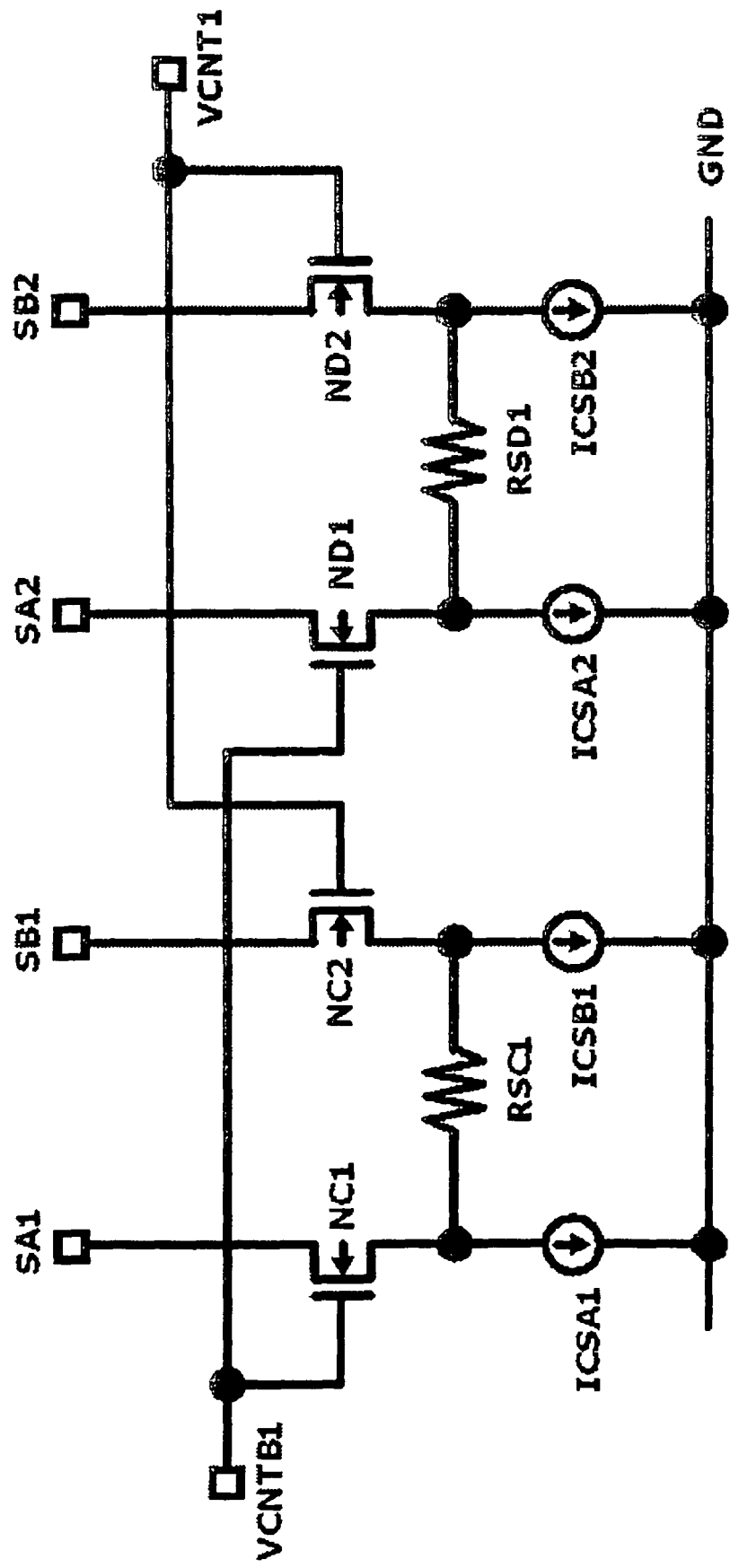
FIG. 12 is a diagram showing an example of a configuration of a current source stage (Current Source stage) in FIG. 10.

FIG. 12 is a diagram showing a configuration of the current source stage (Current source stage) in FIG. 10. Referring to FIG. 12, the current source stage includes NMOS transistors NC1, NC2, ND 1, and ND2 and constant current sources ICSA1, ICSA2, ICSA3, and ICSA4 each with one terminal thereof connected to the GND. Gates of the NMOS transistors NC1 and NC2 are respectively connected to terminals VCNTB1 and VCNT1. Drains of the NMOS transistors NC1 and NC2 are respectively connected to the terminals SA1 and SB1. Sources of the NMOS transistors NC1 and NC2 are respectively connected to the other ends of the constant current sources ICSA1 and ICSB1. A resistor RSC1 is connected between the sources of the NMOS transistors NC1 and NC2. Gates of the NMOS transistors ND1 and ND2 are respectively connected to the terminals VCNTB1 and VCNT1. Drains of the NMOS transistors ND1 and ND2 are respectively connected to terminals SA2 and SB2. Sources of the NMOS transistors ND1 and ND2 are respectively connected to the other ends of the constant current sources ICSA2 and ICSB2. A resistor RSD1 is connected between the sources of the NMOS transistors ND1 and ND2. When a voltage VCNTB1 falls and a voltage VCNT1 rises, current (drain current) that flows through the transistor NC1 is reduced, and current that flows through the transistor NC2 is increased. Current (drain current) that flows through the transistor ND1 is reduced, and current that flows through the transistor ND2 is increased. On the contrary, when the voltage VCNTB1 rises and the voltage VCNT1 falls, the current (drain current) that flows through the transistor NC1 is increased, and the current that flows through the transistor NC2 is reduced. The current (drain current) that flows through the transistor ND1 is increased, and the current that flows through the transistor ND2 is reduced.

When a current value of the constant current source ICSA2 is set to one, a current value of the constant current source ICSA1 is set to r times (in which r is larger than one).

When a current value of the constant current source ICSB2 is set to one, a current value of the constant current source ICSB1 is set to s times (in which s is larger than one). Absolute values of values n, m, r, and s may be arbitrarily set in order to set a limit of the duty correction capability.

A relative ratio (such as n/m) between the values n and m and a relative value (such as r/s) between the values of r and s may be arbitrarily set in order to increase the duty correction capability of one of High and Low levels of an input signal for which duty correction should be made, with respect to the other level.

When the ratio (n/m) is set to be larger than one or the ratio (r/s) is set to be larger than one, this setting is effective when a Low level period is larger than a High level period.

When the ratio (n/m) is set to be smaller than one or the ratio (r/s) is set to be smaller than one, this setting is effective when duty deterioration occurs, which is contrary to the above-mentioned case.

That is, this setting is effective when a direction of the duty deterioration with respect to the High/Low level is known in advance.

A relative ratio (such as n/r) between the values n and r and a relative value (such as m/s) between the values m and s may be arbitrarily set in order to adjust waveform blunting of the outputs OUT1 and OUTB1 and adjust the intensity of the duty correction capability.

(A) In case of (n/r)>1 or (m/s)>1, waveform blunting (at a time of a rise/fall) can be reduced.

(B) In case of (n/r)<1 or (m/s)<1, waveform blunting of one of the output signals OUT1 and OUTB1 can be increased.

The above settings are more effectively for a frequency change in each of clock signals differentially supplied to the input terminals IN1 and INB1. The setting in the case (A), for example, is effective for a high-frequency clock. The setting in the case (B) is effective for a low-frequency clock.

Usually, the values n, m, r, and s are set to n=m=r=s. The absolute values of the variables that range from two to six may be pointed out as an appropriate example, when differential signals with operating frequencies ranging from 500 MHz to 3 GHz are assumed.

A description will be given below about a case where the values n, m, r, and s are set to be equal to four. As a result of providing the ratios with respect to the transistors and currents in FIGS. 10 and 11, the circuit including the transistors NA1, NA2, NA3, and NA4 operates to delay a transition time (fall time) of the output signal OUT1 from High to Low with respect to the signals supplied from the input terminals IN1 and INB1. Regarding the output signals OUT1 and OUTB1 from the circuit including the NMOS transistors NA1 to NA4, a fall time of OUTB1 is faster than a fall time of OUT1 and a rise time of OUT1 is faster than a rise time of OUTB1.

The circuit including the NMOS transistors NB1, NB2, NB3, and NB4 operates to delay a transition time (fall time) of the output signal OUTB1 from High to Low with respect to the signals supplied from the input terminals IN1 and INB1. Regarding the output signals OUT1 and OUTB1 from the circuit including the NMOS transistors NB1 to NB4, a fall time of OUT1 is faster than a fall time of OUTB1, and a rise time of OUTB1 is faster than a rise time of OUT1.

FIGS. 18A to 18H are timing waveform diagrams for explaining an operation of the present example. FIGS. 18A to 18H shows the operation where no variation of duty (duty=50%) is present in each of the inputs IN1 and INB1. In this case, the outputs VCNT1 and VCNTB1 of the duty control voltage generator 20 are equal.

Figure 18A:
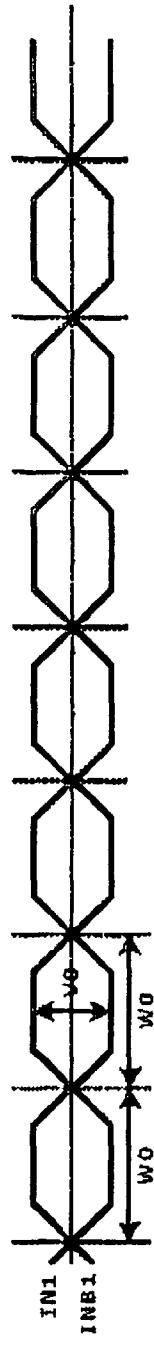
FIGS. 18A to 18H are timing waveform diagrams for explaining an operation of the example of the present invention.
Figure 18B:
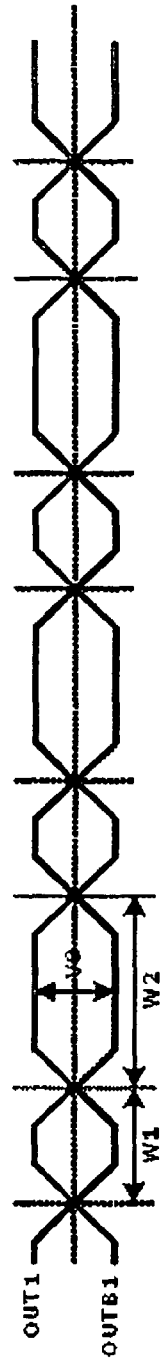

FIG. 18A shows waveforms of the inputs IN and INB1, and FIG. 18B shows waveforms of the output signals OUT1 and OUTB1 generated by the circuit including the NMOS transistors NA1 to NA4. A fall transition of the output signal OUT1 from High to Low is delayed. Further, a rise transition of the output signal OUTB1 from Low to High is delayed. A period from an intersection between a fall of the output signal OUT1 and a rise of the output signal OUTB1 to an intersection between a rise of the output signal OUT1 and a fall of the output signal OUTB1 is reduced from W0 to W1. A period from the intersection between the rise of the output signal OUT1 and the fall of the output signal OUTB1 to an intersection between a fall of the output signal OUT1 and a rise of the output signal OUTB1 is extended from W0 to W2.

Figure 18C:
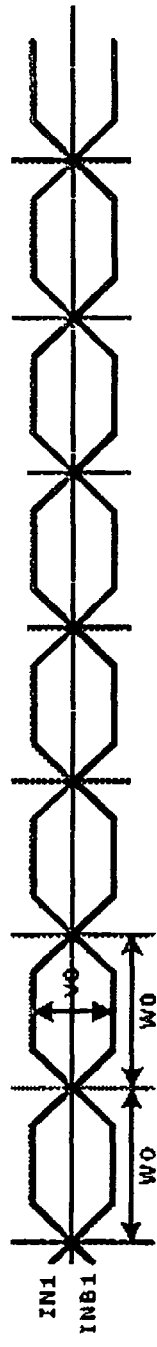
Figure 18D:
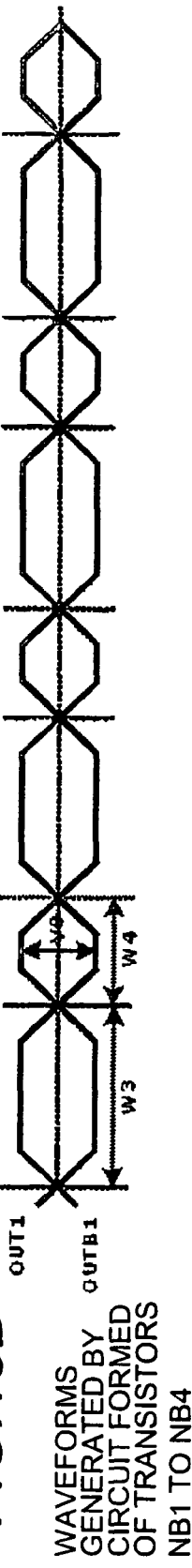

FIG. 18C shows waveforms of the inputs IN and INB1. FIG. 18D shows waveforms of output signals OUT1 and OUTB1 generated by the circuit including the NMOS transistors NB1 to NB4. A rise transition of the output signal OUT1 from Low to High is delayed. A fall transition of the output signal OUTB1 from High to Low is delayed. A period from an intersection between a fall of the output signal OUT1 and a rise of the output signal OUTB1 to an intersection between a rise of the output signal OUT1 and a fall of the output signal OUTB1 is extended from W0 to W3. A period from the intersection between the rise of the output signal OUT1 and the fall of the output signal OUTB1 to an intersection between a fall of the output signal OUT1 and a rise of the output signal OUTB1 is reduced from W0 to W4.

Figure 18E:
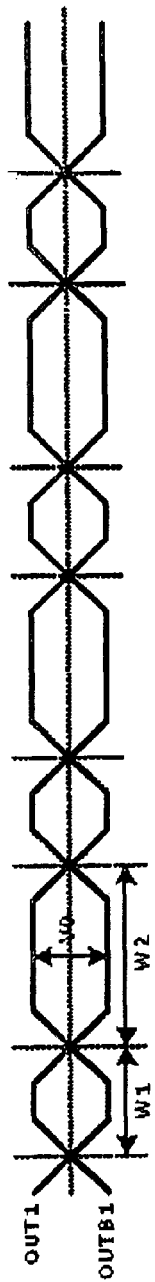
Figure 18F:
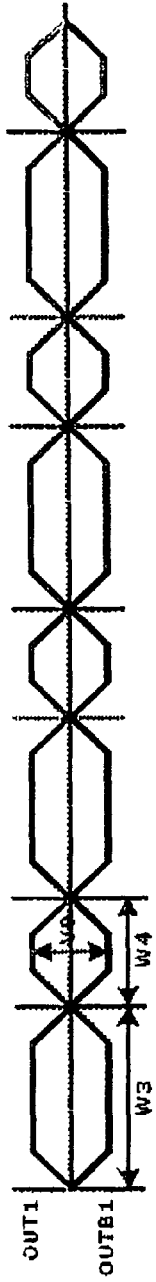
Figure 18G:
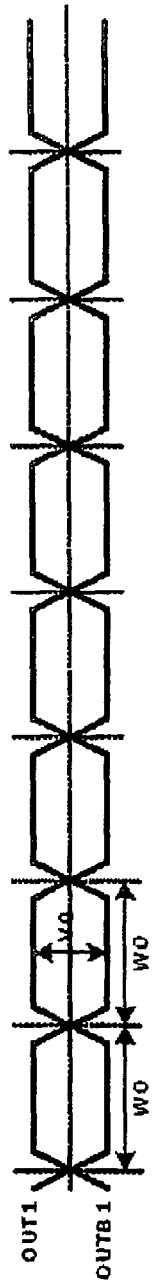

FIGS. 18E, F, and G are diagrams for explaining synthesis of the waveforms generated by the circuit including the NMOS transistors NA1 to NA4 and the waveforms generated by the circuit including NMOS transistors NB1 to NB4. FIG. 18E shows waveforms of the output signals OUT1 and OUTB1 generated by the circuit including the NMOS transistors NA1 to NA4 (which are the same as those in FIG. 18B). FIG. 18F shows waveforms of the output signals OUT1 and OUTB1 generated by the circuit including the NMOS transistors NB1 to NB4 (which are the same as those in FIG. 18D). FIG. 18G shows waveforms of the output signals OUT1/OUTB1 synthesized by feedback.

Figure 18H:
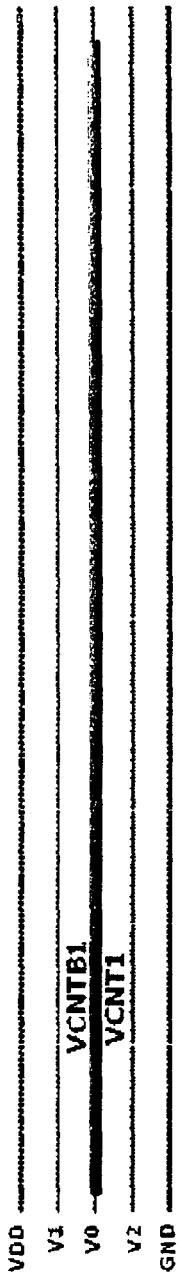

FIG. 18H illustrates the duty control voltages VCNT1 and VCNTB1. By combining the output signals OUT1 and the output signals OUTB1 in FIGS. 18E and 18F (actually by adding currents that flow through the resistors RL1 and RL2), the waveforms in FIG. 18G can be obtained.

The output signal OUT1 from the circuit including the NMOS transistors NA1 to NA4, of which a fall has been delayed is synthesized with the output signal OUT1 from the circuit including the NMOS transistors NB1 to NB4, of which a rise has been delayed. As a result of the synthesis, the output waveform with no duty deterioration is obtained. Synthesis of the output signal OUT1 from the circuit including the NMOS transistors NA1 to NA4 and the output signal OUT1 from the circuit including the NMOS transistors NB1 to NB4 is made at the load resistor RL2, and a result of the synthesis is produced as a terminal voltage of the resistor RL2. Synthesis of the output signal OUTB1 from the circuit including the NMOS transistors NA1 to NA4 and the output signal OUTB1 from the circuit including the NMOS transistors NB1 to NB4 is made at the load resistor RL1, and a result of the synthesis is produced as a terminal voltage of the resistor RL1.

Figure 19E:
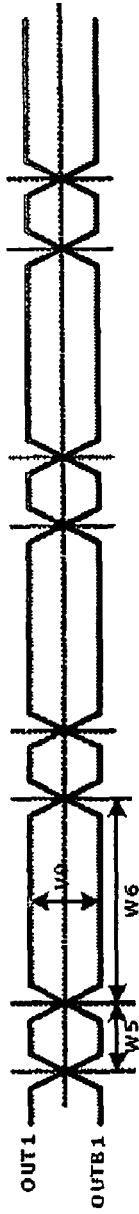
Figure 19F:
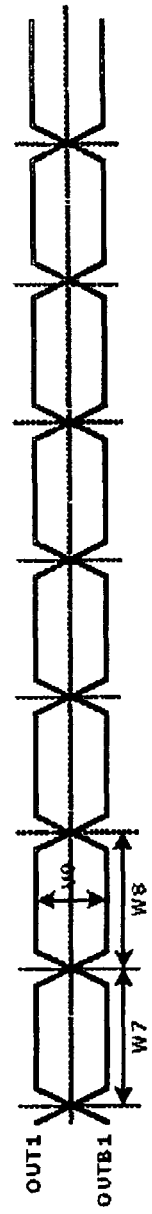
Figure 19G:
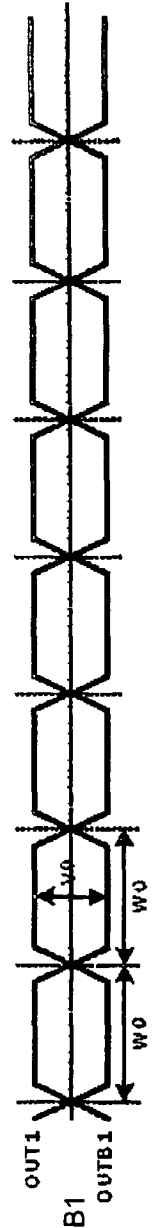

FIGS. 19A to 19H are timing waveform diagrams for explaining an operation that assumes problems of the comparative example described above. FIG. 19A shows input signals IN and INB1, and FIG. 19B shows output signals OUT1 and OUTB1 generated by the circuit including the NMOS transistors NA1 to NA4. The circuit including the NMOS transistors NA1 to NA4 delays a transition of the output signal OUT1 from High to Low. That is, as shown in FIG. 19B, a period from an intersection between a fall of the output signal OUT1 and a rise of the output signal OUTB1 to an intersection between a rise of the output signal OUT1 and a fall of the output signal OUTB1 is reduced to W5 from W1 (W5 being smaller than W1). A period from the intersection between the rise of the output signal OUT1 and the fall of the output signal OUTB1 to an intersection between a fall of the output signal OUT1 and a rise of the output signal OUTB1 is extended from W2 to W6 (W6 being larger than W2).

FIG. 19C shows the input signals IN and INB1. FIG. 19D shows waveforms of output signals OUT1 and OUTB1 generated by the circuit including the NMOS transistors NB1 to NB4. The circuit including the NMOS transistors NB1 to NB4 delays a fall transition of the output signal OUTB1 from High to Low. As shown in FIG. 19D, a period from an intersection between a fall of the output signal OUT1 and a rise of the output signal OUTB1 to an intersection between a rise of the output signal OUT1 and a fall of the output signal OUTB1 is extended from W1 to W7 (W7 being larger than W1). A period from the intersection between the rise of the output signal OUT1 and the fall of the output signal OUTB1 to an intersection between a fall of the output signal OUT1 and a rise of the output signal OUTB1 is reduced from W2 to W8 (W2 being larger than W8). FIGS. 19A and 19C show same waveforms.

Figure 19H:
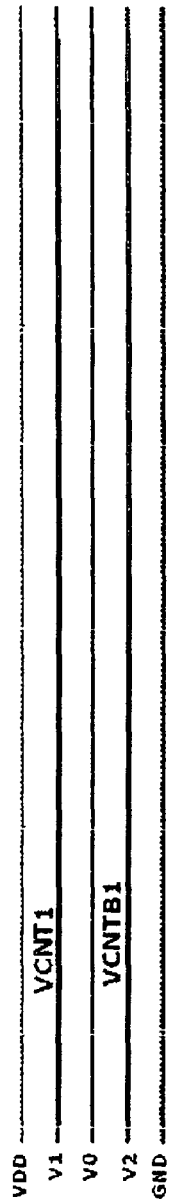

By combining the outputs (in FIG. 19E) of the circuit including the NMOS transistors NA1 to NA4 and the output signals (in FIG. 19F) of the circuit including the NMOS transistors NB1 to NB4, waveforms (in FIG. 19G) with no duty deterioration are output from the outputs OUT1 and OUTB. The duty control voltages VCNT1 and VCNTB1 shown in FIG. 19H are output from the duty control voltage generator 20 in FIG. 4. Since the duty of the input IN1 (accordingly, the output OUT1) is larger than 50%, the duty control voltage VCNT becomes larger than the duty control voltage VCNTB, as described above. The duty control voltages VCNT1 and VCNTB1 are output from the duty control voltage generator 20. In this case, current values at the current terminals SA1 and SA2 are reduced, and current values at the current terminals SB1 and SB2 are increased at the current source stage in FIG. 12. As a result, a driving current for a differential pair including the NMOS transistors NA1 and NA2 is reduced, and a driving current for a differential pair including the NMOS transistors NB1 and NB2 is increased. Thus, feedback control is performed so that the circuit including the NMOS transistors NA1 to NA4 increases a delay of a fall time of the output OUT1, and increases a delay of a fall time of the output OUTB1, and the circuit including the NMOS transistors NB1 to NB4 reduces a fall time of the output OUT1 and reduces a delay of a fall time of the output OUTB1.

In the aforementioned comparative example, a difference is provided to signal amplitude center voltages so as to obtain a duty correction effect. That is, an offset is provided for each of the outputs OUT1 and OUTB1 to vary a High-level output voltage and a Low-level voltage of each of the outputs OUT1 and OUTB1. Amplitudes of the High-level output voltage and the Low-level voltage are thereby varied.

On contrast therewith, in the present invention, the circuit that delays the signal of the output OUT1 that changes from High to Low and the circuit that delays the signal of the output OUT1 that changes from Low to High are provided. Then, the delayed outputs of the circuits are synthesized. Duty correction capability can be determined by a combination of the above-mentioned variables (n, m, r, and s) irrespective of input waveform blunting. Thus, a defective state of output signal vanishing as in the comparative example does not occur.

In the aforementioned comparative example, the amplitudes of the High-level output voltage and the Low-level voltage are varied. In the present example, amplitudes of the High/Low levels of the OUT1 and OUTB1 are constant. Thus, a defective state as in the comparative example, where duty deterioration occurs due to the influence of an input offset of a buffer in a subsequent stage, does not occur, either. Further, using a combination of the variables (n, m, r, and s), the present invention can be used for a high-frequency application as well as a low-frequency application, and can also be effectively applied to a case where a direction of duty variation of the High/Low level is determined in advance.

Figure 13:
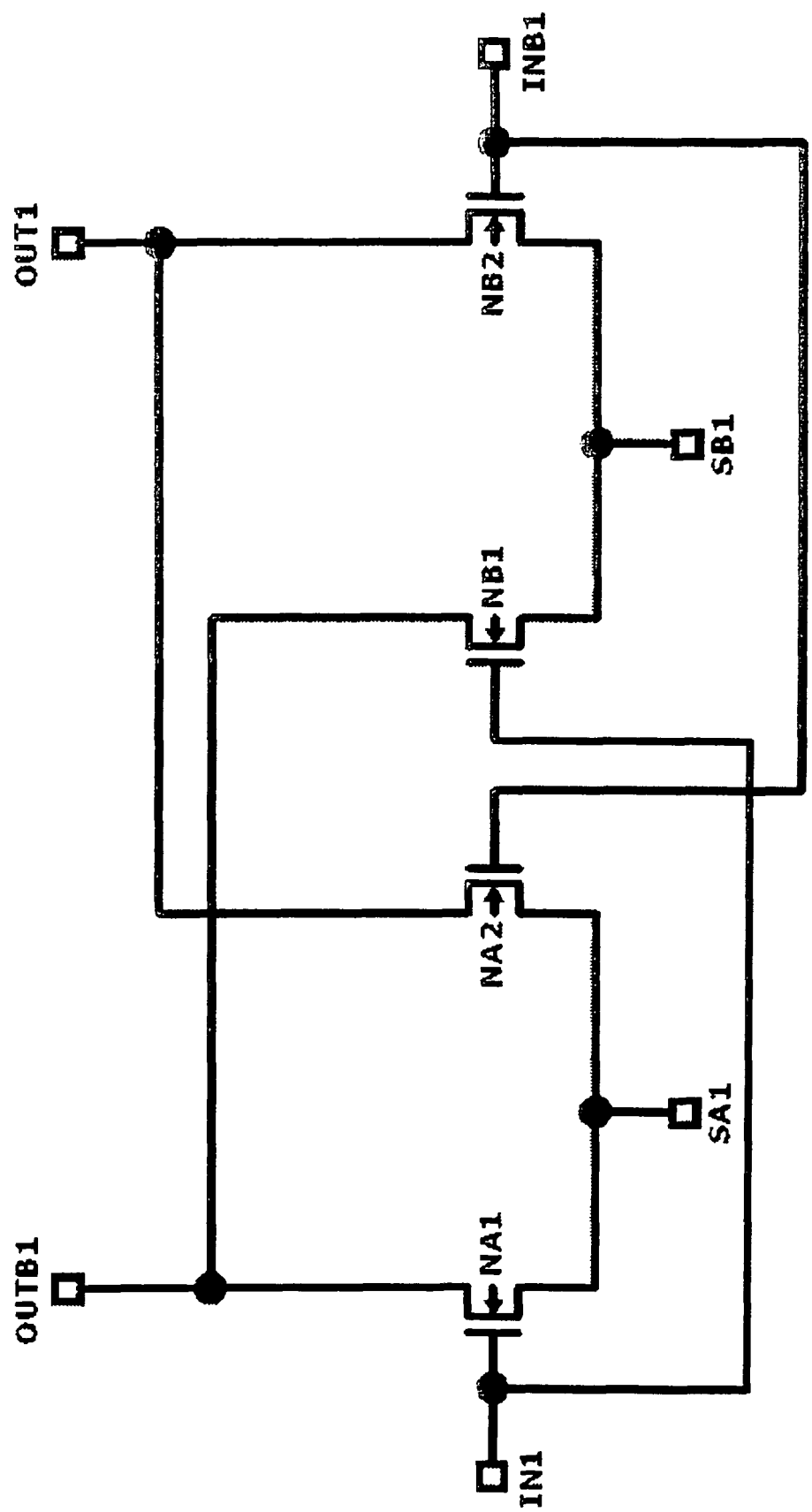
FIG. 13 is a diagram showing another example of the differential stage (Differential stage) in FIG. 10.

FIG. 13 is a diagram showing a configuration of the duty control buffer 10 in FIG. 2 in another example. Referring to FIG. 13, the duty control buffer includes NMOS transistors NA1 and NA2 and NMOS transistors NB1 and NB2. The NMOS transistors NA1 and NA2 have coupled sources connected to a current terminal SA1, have gates respectively connected to input terminals IN1 and INB1, and drains respectively connected to output terminals OUTB1 and OUT1. The NMOS transistors NB1 and NB2 have coupled sources connected to a current terminal SB1, have gates respectively connected to the input terminals IN1 and INB and have drains respectively connected to the output terminals OUTB1 and OUT1. In the present example, the NMOS transistors NA1, NA2, NB1, and NB2 each have the same dimension (W/L) as that described in the example shown in FIG. 11.

Figure 14:
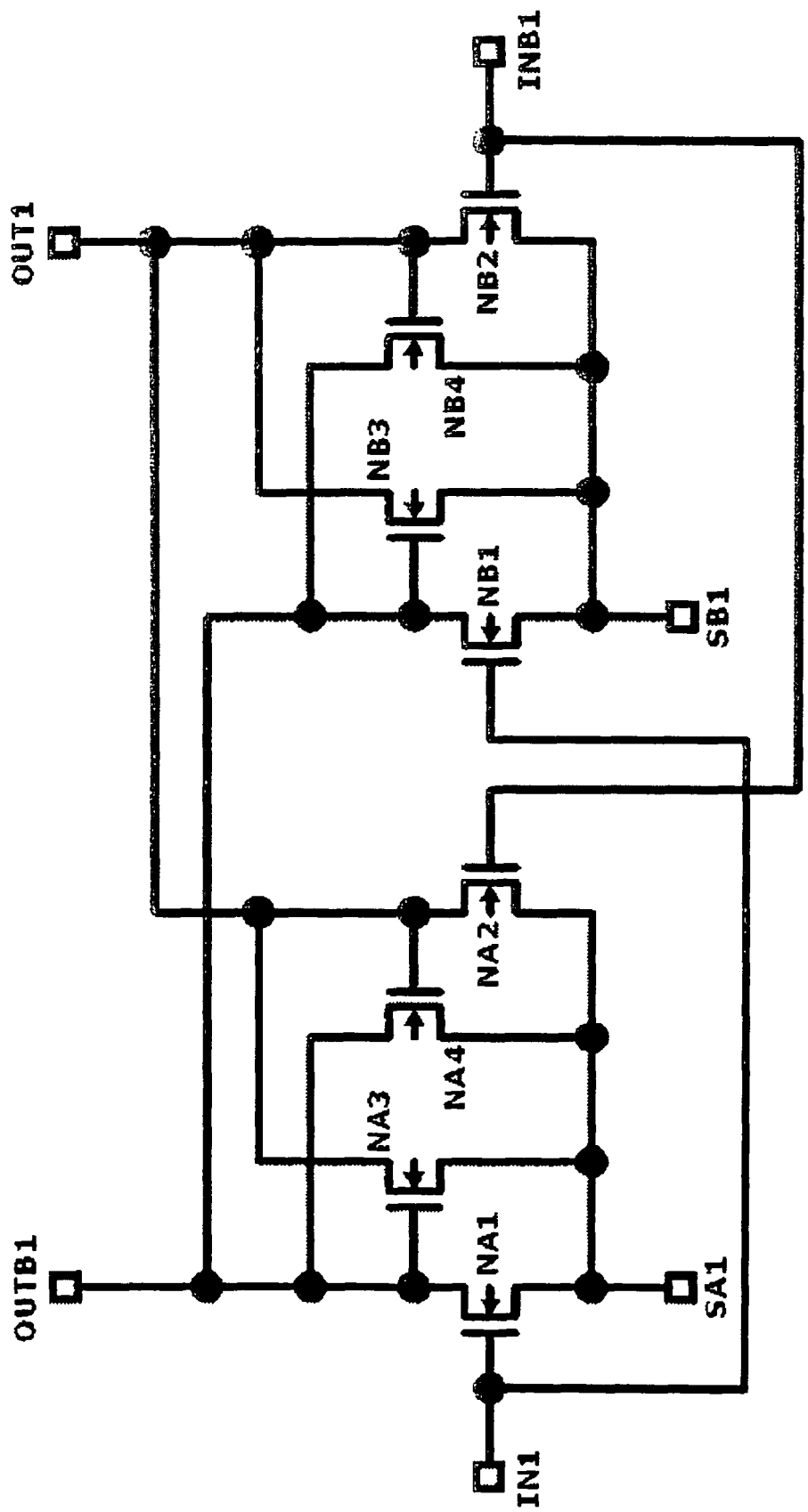
FIG. 14 is a diagram showing a still another configuration example of the differential stage (Differential stage) in FIG. 10.

FIG. 14 is a diagram showing a configuration of the duty control buffer 10 in FIG. 2 in another example. Referring to FIG. 14, the duty control buffer includes NMOS transistors NA1, NA2, NA3, and NA4 and NMOS transistors NB1, NB2, NB3, and NB4. The NMOS transistors NA1, NA2, NA3, and NA4 have sources connected in common to a current terminal SA1. The NMOS transistors NA1 and NA2 have gates respectively connected to input terminals IN1 and INB1 and have drains respectively connected to output terminals OUTB1 and OUT1. The NMOS transistors NA3 and NA4 have gates respectively connected to the output terminals OUTB1 and OUT1 and have drains respectively connected to the output terminals OUT1 and OUTB1. The NMOS transistors NB1, NB2, NB3, and NB4 have sources connected in common to a current terminal SB1. The NMOS transistors NB1 and NB2 have gates respectively connected to the input terminals IN1 and INB1 and have drains respectively connected to the output terminals OUTB1 and OUT The NMOS transistors NB3 and NB4 have gates respectively connected to the output terminals OUTB1 and OUT1 and have drains respectively connected to the output terminals OUT1 and OUTB1. In the present example, the NMOS transistors NA1, NA2, NB1, and NB2 each have the same dimension (W/L) as that described in the example shown in FIG. 11.

Figure 15:
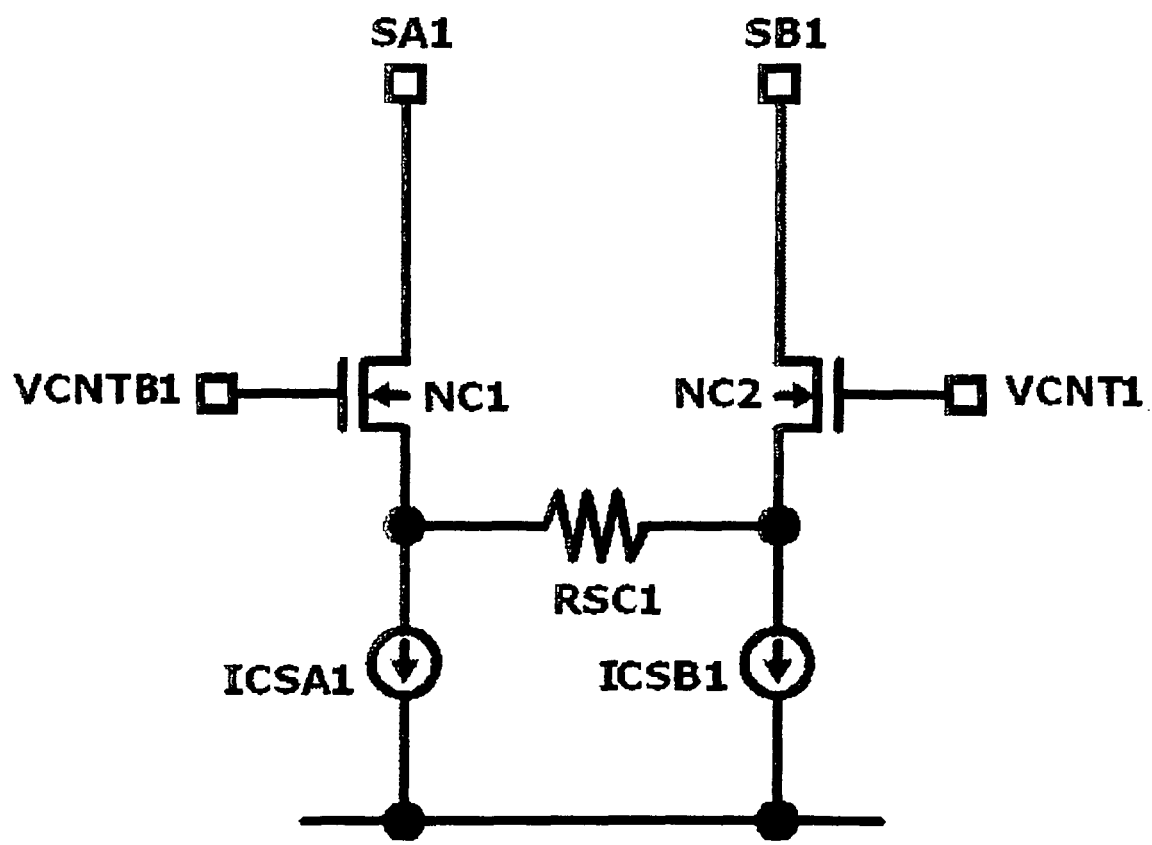
FIG. 15 is a diagram showing a configuration example of the current source stage (Current Source stage) in FIG. 10.

FIG. 15 is a diagram showing configurations of current sources which supply currents to the current terminals SA1 and SB1 shown in FIG. 14. The current source stage in FIG. 15 includes constant current sources ICSA1 and ICSAB1 each having one end connected to the GND, and NMOS transistors NC1 and NC2. Sources of the NMOS transistors NC1 and NC2 are respectively connected to the other ends of the constant current sources ICSA1 and ICSAB1 and connected via a resistor RSC1. The NMOS transistors NC1 and NC2 have gates respectively connected to terminals VCNTB1 and VCNT1 and have drains respectively connected to the current terminals SA1 and SB1. A total sum of currents that flow through the load resistor RL1 for the output terminal OUTB1 and the load resistor RL2 for the output terminal OUT1 is set to a sum of current values of the constant current sources ICSA1 and ICSB1.

Figure 16:
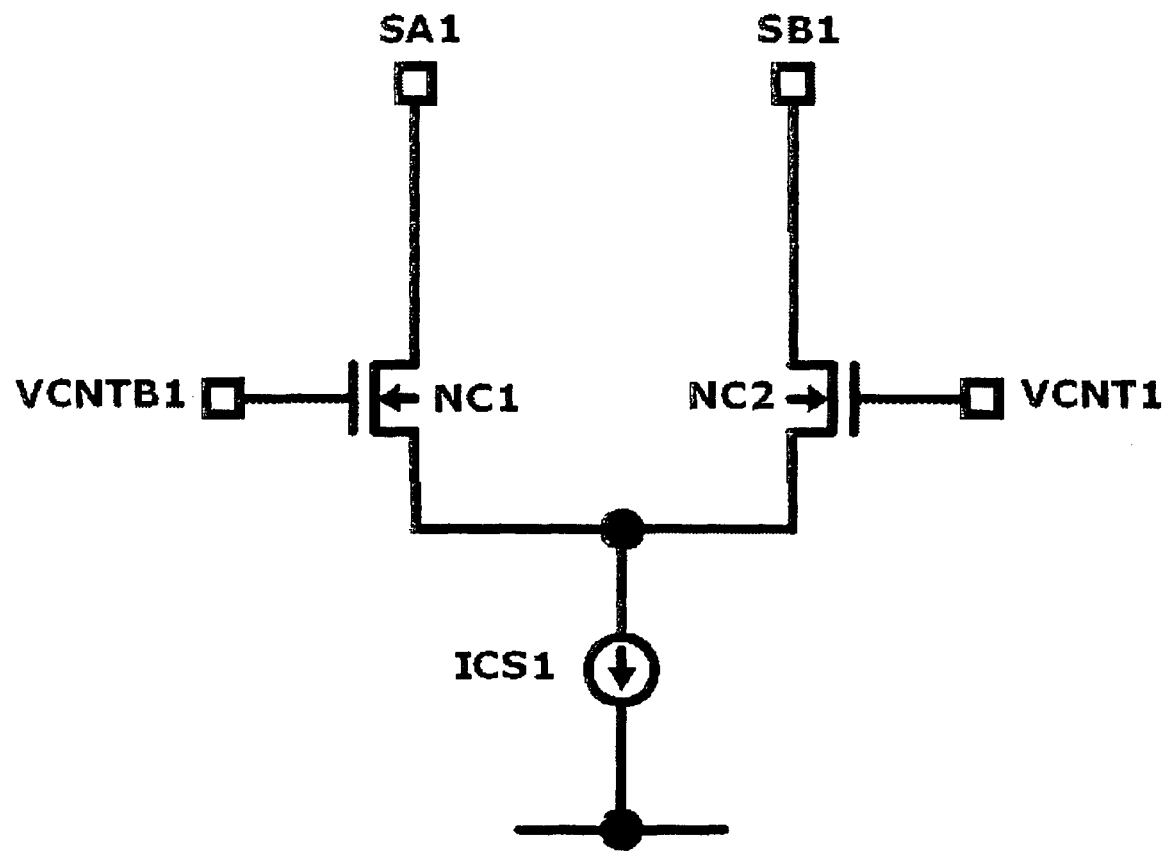
FIG. 16 is a diagram showing a configuration example of the current source stage (Current Source stage) in FIG. 10.

FIG. 16 is a diagram showing a configuration of a current source that supplies current to the current terminals SA1 and SB1 shown in FIG. 14. The current source stage in FIG. 16 includes a constant current source ICSA1 having one terminal thereof connected to the GND, and NMOS transistors NC1 and NC2 which have coupled sources connected to the other end of the constant current source ICSA1, have gates respectively connected to terminals VCNTB1 and VCNT1 and have drains respectively connected to the current terminals SA1 and SB1. A total sum of currents that flow through the load resistor RL1 for the output terminal OUTB1 and the load resistor RL2 for the output terminal OUT1 is set to a current value of the constant current source ICSA1.

Figure 17:
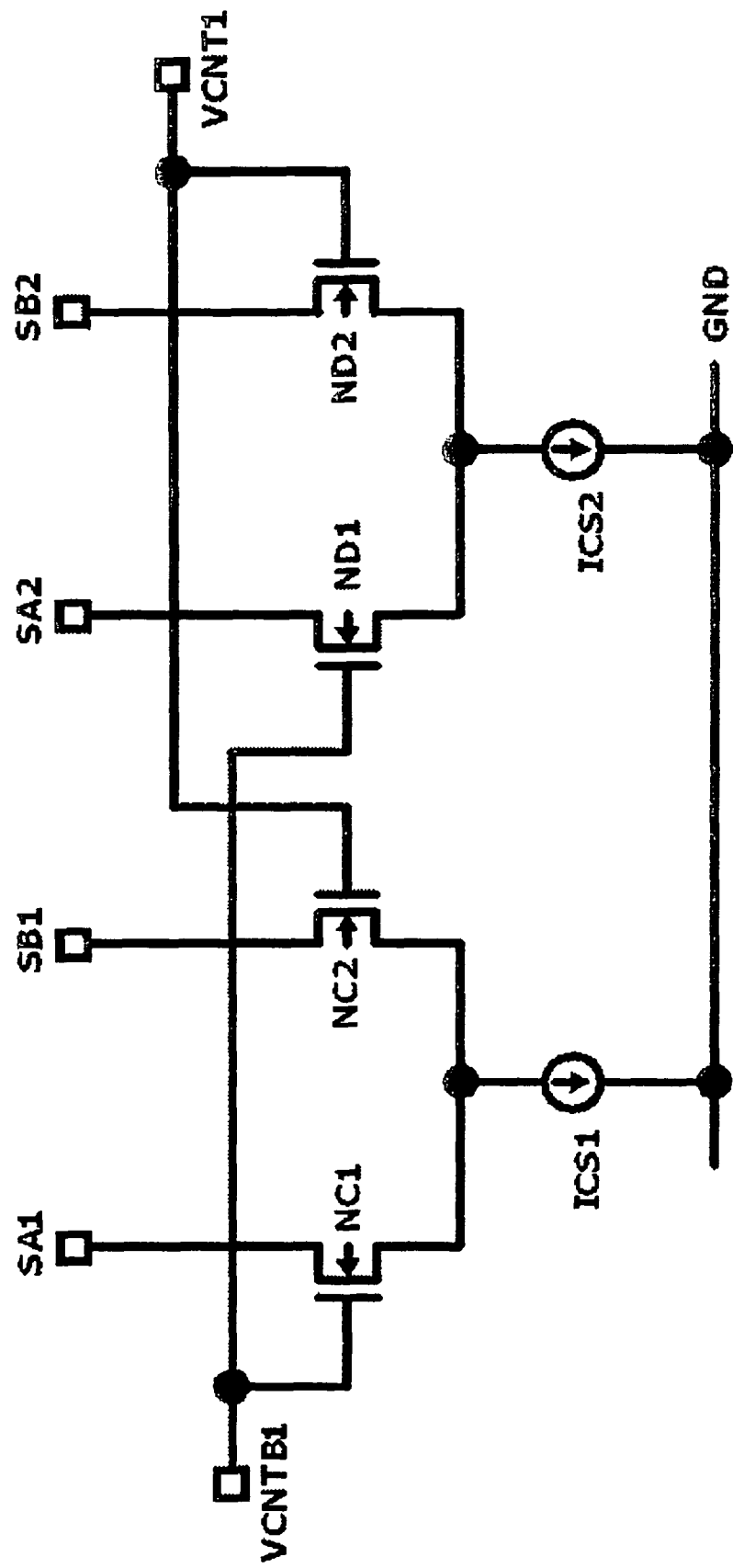
FIG. 17 is a diagram showing a configuration example of the current source stage (Current Source stage) in FIG. 10.

FIG. 17 is a diagram showing another configuration example of the current source stage in FIG. 10. FIG. 17 is obtained by deleting the NMOS transistors NA3, NA4, NB3, and NB4 from the configuration of the differential stage in FIG. 14. Referring to FIG. 17, the current source stage includes constant current sources ICSA1 and ICSA2, each having one end connected to the GND, NMOS transistors NC1 and NC2, and NMOS transistors ND1 and ND2. The NMOS transistors NC1 and NC2 have sources connected in common to the other end of the constant current source ICSA1, have gates respectively connected to terminals VCNTB1 and VCNT1, and drains respectively connected to the current terminals SA1 and SB2. The NMOS transistors ND1 and ND2 have sources connected in common to the other end of the constant current source ICSA2, have gates respectively connected to the terminals VCNTB1 and VCNT1 and have drains respectively connected to the current terminals SA2 and SB2. A sum of currents that are supplied to the terminals SA1 and SB1 is set to a current value of the constant current source ICS1. A sum of currents that are supplied to the terminals SA2 and SB2 is set to a current value of the constant current source ICS2.

A description is directed to a case where the differential stage, current source stage, and the like of the duty control buffer 10 are including the NMOS transistors. A transistor conductivity type in the present invention is not limited to NMOS. The differential stage and current source stage may be of course including PMOS transistors. In this case, the current source stage is connected to the power supply VDD, and the resistors RL11 and RL12 are connected to the GND in FIGS. 10 and 11.

Each disclosure of Patent Document 1 described above is incorporated herein by reference. Modifications and adjustments of the exemplary embodiment and the examples are possible within the scope of the overall disclosure (including claims) of the present invention, and based on the basic technical concept of the invention. Various combinations and selections of various disclosed elements are possible within the scope of the claims of the present invention. That is, the present invention of course includes various variations and modifications that could be made by those skilled in the art according to the overall disclosure including the claims and the technical concept.

What is claimed is:

1. A duty control buffer circuit comprising:
 a first differential circuit that differentially receives input signals and generates first differential output signals comprising a non-inverting output signal and an inverting output signal, the first differential output signals making a transition responsive to a transition of the input signals, the first differential output signals having a predetermined magnitude relationship between a time of at least one of falling and rising transitions of the non-inverting output signal thereof and a time of the one of falling and rising transitions of the inverting output signal thereof;
 a second differential circuit that differentially receives the input signals in common with the first differential circuit and generates second differential output signals comprising a non-inverting output signal and an inverting output signal, the second differential output signals making a transition responsive to a transition of the input signals, the second differential output signals having a magnitude relationship between a time of the one of falling and rising transitions of the non-inverting output signal thereof and a time of the one of falling and rising transitions of the inverting output signal thereof, the magnitude relationship of the second differential output signals being opposite to the magnitude relationship of the first differential output signals;
 first and second latch circuits that respectively receive the outputs of the first and second transistors and have outputs thereof cross-connected to the outputs of the second and first transistors;
 third and fourth latch circuits that respectively receive the outputs of the third and fourth transistors and have outputs thereof cross-connected to the outputs of the fourth and third transistors;
 ninth and tenth transistors respectively connected to the first and second constant current sources, the ninth and tenth transistors forming a differential pair that differentially receives first and second control signals, the ninth and tenth transistors respectively forming the first and third current sources;
 a first resistor connected between a connection node of the first constant current source and the ninth transistor and a connection node of the second constant current source and the tenth transistor;
 eleventh and twelfth transistors respectively connected to the third and fourth constant current sources, the eleventh and twelfth transistors forming a differential pair that differentially receive the first and second control signals, the eleventh and twelfth transistors forming the second and fourth current sources; and
 a second resistor connected between a connection node of the third constant current source and the eleventh transistor and a connection node of the fourth constant current source and the twelfth transistor being connected,
 a signal obtained by combining the non-inverting output signals of the first and second differential output signals and a signal obtained by combining the inverting output signals of the first and second differential output signals being produced respectively at first and second output terminals of the duty control buffer circuit,
 wherein the first differential circuit comprises:
  a first current source; and
  a first differential pair that is driven by the first current source,
  the first differential pair including first and second transistors having current driving capabilities with a predetermined ratio therebetween, and
 wherein the second differential circuit comprises:
  a second current source; and
  a second differential pair that is driven by the second current source,
  the second differential pair including third and fourth transistors having current driving capabilities with a predetermined ratio therebetween, the second and fourth transistors having control terminals connected in common to a first input terminal of the duty control buffer circuit, the first and third transistors having control terminals connected in common to a second input terminal of the duty control buffer circuit, outputs of the second and fourth transistors being connected in common to the first output terminal, outputs of the first and third transistors being connected in common to the second output terminal, wherein:

the first differential circuit further comprises a third current source and the second differential circuit further comprises a fourth current source, the first latch circuit comprises a fifth transistor connected between the third current source and the first output terminal, a control terminal of the fifth transistor being connected to the second output terminal, the second latch circuit comprises a sixth transistor connected between the third current source and the second output terminal, a control terminal of the sixth transistor being connected to the first output terminal, the third latch circuit comprises a seventh transistor connected between the fourth current source and the first output terminal, a control terminal of the seventh transistor being connected to the second output terminal, and the fourth latch circuit comprises an eighth transistor connected between the fourth current source and the second output terminal, a control terminal of the eighth transistor being connected to the first output terminal.

2. The duty control buffer circuit according to claim 1, wherein the first differential circuit comprises a first differential pair that differentially receives the input signals, the first differential pair comprising a pair of transistors having current driving capabilities with a predetermined ratio therebetween, and the second differential circuit comprises a second differential pair that differentially receives the input signals, the second differential pair comprising a pair of transistors having current driving capabilities with a predetermined ratio therebetween, non-inverting outputs of output pairs of the first and second differential pairs being connected in common, and inverting outputs of the output pairs of the first and second differential pairs being connected in common, and wherein the duty control buffer circuit further comprises:

a load element pair connected between a power supply and the commonly connected output pairs of the first and second differential pairs; and a current source stage that respectively supplies to the first and second differential pairs currents corresponding to control signals supplied thereto, the non-inverting and inverting output signals being output from connection nodes between the commonly connected output pairs of the first and second differential pairs and the load element pair.

3. The duty control buffer circuit according to claim 2, wherein the first differential pair delays the time of one of the falling and rising transitions of the non-inverting output signal of the output pair thereof, with respect to the time of the transition of the inverting output signal of the output pair thereof, and the second differential pair delays the time of the one of the falling and rising transitions of the inverting output signal of the output pair thereof, with respect to the time of the transition of the non-inverting output signal of the output pair thereof.

4. A duty correction circuit comprising:

the duty control buffer circuit as set forth in claim 1; and a duty correction voltage generator that receives outputs of the duty control buffer circuit, detects a duty error, and generates the first and second control signals.

5. A duty correction circuit comprising:

a duty control buffer that receives input signals, the duty control buffer comprising:

first and second differential pairs that differentially receive the input signals in common, current driving capabilities of output pairs of the first and second differential pairs being unbalanced;

first outputs of the output pairs of the first and second differential pairs being connected together and second outputs of the output pairs of the first and second differential pairs being connected together;

a duty correction voltage generator that receives outputs of the duty control buffer, the duty correction voltage generator detecting a duty error to generate differentially control signals;

a load element pair connected between a power supply and the commonly connected output pairs of the first and second differential pairs;

a current source stage that respectively supplies to the first and second differential pair driving currents corresponding to the control signals;

a first current source that supplies a current to the first differential pair that includes first and second transistors;

a second current source that supplies a current to the second differential pair that includes third and fourth transistors driven;

first and second latch circuits that receive outputs of the first and second transistors and have outputs thereof connected to the second and first output terminals;

third and fourth latch circuits that receive outputs of the third and fourth transistors and have outputs thereof connected to the second and first output terminals;

a first constant current source;

a second constant current source;

a third constant current source;

a fourth constant current source;

ninth and tenth transistors respectively connected to the first and second constant current sources, the ninth and tenth transistors forming a differential pair that differentially receives first and second control signals, the ninth and tenth transistors respectively comprising components of the first and third current sources;

a first resistor connected between a connection node of the first constant current source and the ninth transistor and a connection node of the second constant current source and the tenth transistor;

eleventh and twelfth transistors respectively connected to the third and fourth constant current sources, the eleventh and twelfth transistors forming a differential pair that differentially receives the first and second control signals; and a second resistor connected between a connection node of the third constant current source and the eleventh transistor and a connection node of the fourth constant current source and the twelfth transistor; the eleventh transistor and the twelfth transistors respectively comprising components of the second and fourth current sources, wherein in the first and second differential pairs, control terminals of the first and third transistors are connected in common to a first input terminal, control terminals of the second and fourth transistors are connected in common to a second input terminal, the input signals are differentially supplied to the first and second input terminals, outputs of the first and third transistors are connected in common to a first output terminal of the output pairs, outputs of the second and fourth transistors are connected in common to a second output terminal of the output pairs, and a current driving capability of the first transistor is set to be larger than a current driving capability of the second transistor and a current driving capability of the fourth transistor is set to be larger than a current driving capability of the third transistor, wherein the first latch circuit comprises a fifth transistor connected between a third current source and the first output terminal in parallel with the second transistor, the fifth transistor having a control terminal connected to the second output terminal;

the second latch circuit comprises a sixth transistor connected between the third current source and the second output terminal in parallel with the first transistor, the sixth transistor having a control terminal connected to the first output terminal;

the third latch circuit comprises a seventh transistor connected between a fourth current source and the first output terminal in parallel with the fourth transistor, the seventh transistor having a control terminal connected to the second output terminal; and the fourth latch circuit comprises an eighth transistor connected between the fourth current source and the second output terminal in parallel with the third transistor, the eighth transistor having a control terminal connected to the first output terminal.

6. A duty correction circuit comprising:

a duty control buffer that receives input signals, the duty control buffer comprising:

first and second differential pairs that differentially receive the input signals in common, current driving capabilities of output pairs of the first and second differential pairs being unbalanced, first outputs of the output pairs of the first and second differential pairs being connected together and second outputs of the output pairs of the first and second differential pairs being connected together;

a duty correction voltage generator that receives outputs of the duty control buffer, the duty correction voltage generator detecting a duty error to generate differentially control signals;

a load element pair connected between a power supply and the commonly connected output pairs of the first and second differential pairs; and a current source stage that respectively supplies to the first and second differential pair driving currents corresponding to the control signals, wherein the duty correction voltage generator comprises:

a current source;

a differential pair that is driven by the current source and differentially receives the outputs of the duty control buffer;

first and second current mirrors that respectively receive currents which flow to an output pair of the differential pair and reflect the currents; and first and second capacitors respectively connected to outputs of the first current mirror and the second current mirror, terminal voltages of the first and second capacitors being respectively set as the first and second control signals.

* * * * *